United States Patent [19]
Smith et al.

[11] Patent Number: 5,262,730
[45] Date of Patent: Nov. 16, 1993

[54] APPARATUS AND METHOD FOR DETERMINING THE PERMITTIVITY OF SAMPLES OF MATERIAL OVER A WIDE FREQUENCY BAND

[75] Inventors: Michael J. A. Smith, Rugby; Philip C. J. Pring, Weston-Super-Mare, both of England

[73] Assignee: British Technology Group Ltd., London, England

[21] Appl. No.: 344,592

[22] Filed: Apr. 28, 1989

[30] Foreign Application Priority Data

Apr. 29, 1988 [GB] United Kingdom ............... 8810226

[51] Int. Cl.$^5$ ........................................... G01R 27/28
[52] U.S. Cl. .................................. 324/650; 324/651; 324/673; 324/681
[58] Field of Search ............... 324/650, 673, 659, 681

[56] References Cited

U.S. PATENT DOCUMENTS 4,467,271 8/1984 Ruckenbauer .................. 324/650
4,481,464 11/1984 Noguchi ........................ 324/650

FOREIGN PATENT DOCUMENTS 1541413 2/1979 United Kingdom .
2063493 6/1981 United Kingdom .

OTHER PUBLICATIONS

Edmonds, I. R., et al., "A Spectrometer for the Measurement of Complex Permittivity", Journal of Physics E: Scientific Instruments 1972, vol. 5, pp. 1067–1071.
Pratt, G. J., et al., "A Wide-band Bridge for the Measurement of the Complex Permittivity of Polymeric Solids and Other Materials", Journal of Physics E, 1982, vol. 15, pp. 927–933.
T. Furukawa et al., "Computer-Controlled Apparatus for Measuring Complex Elastic, Dielectric and Piezoelectric Constants of Polymer Films", vol. 57, No. 2, Feb. 1986, pp. 285–292.
A. Kakimoto et al., "Precise Measurement of Dielectric Properties of Frequencies from 1 kHz to 100 MHz", vol. 58, No. 2, Feb. 1987, pp. 269–275.

Primary Examiner—Kenneth A. Wieder
Assistant Examiner—Solids Jose M.
Attorney, Agent, or Firm—Cushman, Darby & Cushman

[57] ABSTRACT

Measurements of the permittivity of samples over a very wide frequency range and a wide temperature range have previously involved such problems as changing parts of the measuring equipment in different regions of the frequency range, substituting one of the components of a bridge used as part of the equipment to obtain bridge balance, and limited permittivity resolution. The present invention employs a capacitance bridge formed by a sample held between electrodes, a series capacitor and a detector comprising a high input impedance amplifier and correlators. The bridge is balanced by applying voltages of known relative amplitude and phase constructed from outputs having relative phases of 0°, 90° and 180° of two phase-locked oscillators. The voltages are constructed using phase shifters, attenuators and summer-driver circuits. At low frequencies the applied voltages are obtained from a waveform synthesizer. In order to allow for any inaccuracies in the amplitude and phase of the applied voltages, a reference bridge is provided which comprises two capacitors connected in series and a detector which includes a high input impedance amplifier, connected between the junction of the capacitors and a common terminal.

31 Claims, 10 Drawing Sheets

APPARATUS AND METHOD FOR DETERMINING THE PERMITTIVITY OF SAMPLES OF MATERIAL OVER A WIDE FREQUENCY BAND

The present invention relates to a wide-band permittivity spectrometer and a method of operating the spectrometer.

Dielectric data in the sub-gigahertz region, expressed as the real and imaginary components of complex relative permittivity, can provide valuable information on molecular or atomic processes within a material. The acquisition of data in this region has been limited by the lack of a sensitive instrument able to span the dielectric resonances which are broad-band in frequency terms and extend over a wide temperature range. Thus complete dielectric characterisations of materials are rare and normally require the integration of several measuring techniques.

Two previous spectrometers relevant to this subject have been described in the papers: "A Spectrometer for the Measurement of Complex Permittivity" by I. R. Edmonds and M. J. A. Smith, Journal of Physics E: Scientific Instruments 1972, Volume 5, pages 1067 to 1071, and "A Wide-band Bridge for the Measurement of the Complex Permittivity of Polymeric Solids and Other Materials" by G. J. Pratt and M. J. A. Smith, Journal of Physics E, 1982, Volume 15, pages 927 to 933. In the former the spectrometer is based on a two arm bridge in which two voltage sources in phase opposition are connected in series across the arms (one of which is a reference capacitor), also connected in series, and a detector is connected between the junctions of the sources and the arms. The real and imaginary components of permittivity are derived from the unbalanced bridge output. The main disadvantages of this bridge are related to the degree of imbalance which creates errors and can limit the permittivity resolution. The latter paper also describes a two-arm bridge having two phase opposed voltage sources but operated in a substitution mode in which the bridge is partly balanced and the output due to a sample is compared with that obtained when the sample is replaced by a combination of known capacitors and resistors. This bridge is capable of providing continuous dielectric data over eight decades of frequency from $3 \times 10^{-2}$ Hz to $3 \times 10^6$ Hz. Errors related to the degree of imbalance also occur but are less significant in this bridge because of the partial balance. The need to replace capacitors and resistors leads, for reasons of spatial extent, to a limitation on high frequency performance. Despite the relative excellence of its performance, the spectrometer of Pratt and Smith still falls short of the ideal required to study the many interesting materials incorporating dielectric processes.

Another form of two arm bridge sometimes used for permittivity measurements employs a voltage source connected by way of a capacitor containing a sample to be measured to the input of a very high gain inverting amplifier. The output of the amplifier is fed back to its input through a parallel combination of capacitance and resistance with the result that the amplifier input voltage approaches zero. The amplifier input terminal is analogous to the point at which a detector is connected in a two arm bridge and thus the amplifier provides a form of automatic balance for the bridge. Also the amplifier output provides a voltage analogous to the second voltage of a two arm bridge and this voltage can be analysed to allow permittivity to be calculated. The main disadvantage of this self balancing bridge is the impossibility in practice of designing a wide-band amplifier of high voltage gain at high frequencies, for example over 1 MHz. A low voltage gain leads to a non-zero amplifier input voltage equivalent to a bridge imbalance and, as a conseqence, the creation of errors. In addition problems of amplifier bias (if feedback is to be by way of a capacitor), propagation delay in the amplifier and instability occur.

Accuracy of permittivity determination requires an alternating field of known distribution within the sample. Where for example a capacitor containing a sample is a parallel plate arrangement of two electrodes, the field distribution at the fringes of the arrangement may be unknown thereby causing anomalous fringe impedances to contribute to the measured impedance. In addition fringe fields may induce further anomalous impedances due to charge displacement across the edge surfaces of the sample. These anomalous effects may be minimised by a guard electrode surrounding the electrode on the balance side of the sample capacitor with the electrode on the other side of the sample capacitor having an area at least equal to that bounded by the periphery of the guard electrode. The guard electrode is held at a potential equal to that of the electrode it surrounds but is not connected to the bridge balance point. This latter condition is difficult to satisfy with an unbalanced bridge at other than low frequencies but the condition is easily satisfied with a balanced two-voltage two-arm bridge at balance for all frequencies by connecting the guard electrode to the junction of the two voltages, that is to the common terminal of the bridge.

According to a first aspect of the present invention there is provided apparatus for determining the permittivity of samples of material comprising first, second, third and common terminals, a sample holder having two electrodes which together with a sample of material, when present, form a first capacitor connected between the first and third terminals, a second capacitor having no significant resistive or inductive component of impedance over a predetermined frequency band in which permittivity measurements are to be made using the apparatus, connected in between the second and third terminals, means for generating two oscillatory voltages at the same frequency, adjustable over a wide frequency range, for application between the first and common terminals, and the second and common terminals, respectively, from source impedances which are low compared with the impedances between the first and common terminals, and between the second and common terminals, respectively, means for independently adjusting the relative phase and amplitude of the two voltages before application to the said terminals and for providing a precise indication of the said relative phase and amplitude, and a signal detector connected to be between the third and common terminals, and having an input impedance such that an out-of-balance signal can be detected allowing balance between voltages between the third and common terminals due to the first and second voltages to be determined in practice or theoretically, whereby the complex permittivity of the sample at a current frequency of the said voltages can be calculated from the said relative amplitude and phase at balance.

Where the parallel resistive or inductive component of impedance is so high that it can be neglected, then an impedance is said in this specification and claims to have no significant resistive or inductive component.

The bridge according to the invention is an arrangement of two voltages and two arms in which the voltages (first and second oscillatory voltages) may be synthesised (their value at balance being used for permittivity calculation) to provide, if necessary, bridge balance by external voltage synthesis commands, and the arms are respectively, and without substitution of components, the sample and a balance capacitor. Since imbalance, component substitution and the requirement for a high gain amplifier are avoided, the problems mentioned above for the other forms of two-voltage two-arm bridge do not occur and permittivity determination of high precision may be obtained over a predetermined frequency band extending over thirteen decades of frequency from $10^{-5}$ Hz to 100 MHz or more. Using suitable replication of means, the invention also allows simultaneous operation at more than one current frequency as may be required for the study of coupled dielectric processes.

The sample holder can be provided with a guard electrode connected as described below.

Preferably the signal detector has a capacitive input with the advantage that the bridge impedances associated with the third terminal scale with frequency; that is their values relative to one another remain approximately in the same ratios. Dielectric samples are usually primarily capacitive and therefore a capacitive bridge is suitable. A further advantage of a signal detector having a capacitive input is that extraction of charge from the sample at d.c. is avoided.

The means for generating two oscillatory voltages may comprise a waveform synthesizer for frequencies below about 20 kHz and, for higher frequencies, either a single oscillator arranged to have three outputs: a second leading a first by 180° and a third leading the first by 90°, or two oscillators arranged to generate the three outputs.

The means for adjusting the relative phases and amplitudes of the oscillatory voltages may then comprise respective means for adjusting the relative phases of the three outputs, respective means for adjusting the relative amplitudes of the three outputs, the first output forming one of the oscillatory voltages, and means for summing the outputs of the second and third outputs after phase and amplitude adjustment to form the other of the oscillatory voltages.

Where two oscillators are used, each may comprise an inductor and capacitance means connected as a parallel resonant circuit having a variable resonance frequency, a first amplifier stage being a voltage follower coupled to the resonant circuit and providing a sinusoidal output voltage at the resonance frequency with no significant harmonic content, a second amplifier stage coupled to the first stage and providing an output at the resonance frequency but containing significant harmonics, the second stage having a magnitude of large signal voltage transfer function decreasing progressively with amplitude of input voltage thereby providing fast amplitude limiting by power shedding, and an attenuator providing positive feedback from the second stage to a voltage enhancing tap on the inductor, the attenuator including means for controlling attenuation in dependence upon a time-averaged amplitude of the output of the first or the second stage so as to provide a constant adjustable said time average amplitude at the resonance frequency.

In this way the first stage provides a sinusoidal output, the second stage provides short term stabilisation and the attenuator provides long term stabilisiation.

An advantage of first and second oscillators constructed in this way is that a frequency range of 10 to 1 or greater can be obtained with a single inductor in the resonant circuit. Furthermore, the output may be of constant adjustable amplitude and low distortion.

The calculation of values of permittivity using the present invention depends on setting the relative phase and amplitude of the two oscillatory voltages correctly. For this purpose a reference bridge may be added which comprises two adjustable capacitors connected in series between the first and second terminals so as to be in close symmetrical proximity to the first and second capacitors and a further signal detector connected between the junction of these two adjustable capacitors and the common terminal.

According to a second aspect of the present invention there is provided a method of determining the permittivity of a sample of material comprising the steps of forming a first capacitor with a sample as dielectric within a temperature controlled chamber, connecting a second capacitor having no significant resistive or inductive component of impedance over the said band, in series with the first capacitor between first and second terminals, generating two oscillatory voltages at the same frequency and applying these voltages between the first terminal and a common terminal, and the second terminal and the common terminal, respectively, using a signal detector to obtain an indication of the out-of-balance voltage between a third terminal between the first and second capacitors and the common terminal, determining either in practice or theoretically the values of the relative phase and amplitude of the said two voltages which give zero out-of-balance voltage and calculating the complex permittivity of the sample at the said frequency from the values determined.

According to a third aspect of the present invention there is provided a method of determining the permittivity of a sample of material over a wide frequency band and a wide temperature range comprising the steps of forming a first capacitor with a sample as dielectric within a temperature controlled chamber, connecting a second capacitor having no significant resistive or inductive component of impedance over the said band, in series with the first capacitor between first and second terminals, adjusting the temperature in the chamber to a value within a range to be measured, generating two oscillatory voltages at the same frequency having known relative phase and amplitude and applying these voltages between the first terminal and a common terminal, and the second terminal and the common terminal, respectively, using a signal detector to obtain an indication of the out-of-balance voltage between a third terminal between the first and second capacitors and the common terminal, determining either in practice or theoretically the values of the said relative phase and amplitude of the two voltages which give zero out-of-balance voltage and calculating the complex permittivity of the sample at the said frequency from the values determined, and repeating the steps of adjusting the temperature within the chamber, generating two voltages, obtaining an indication of the out-of-balance voltage, determining the values of relative phase and amplitude and calculating permittivity for a plurality of different frequencies of the two oscillatory voltages over the said band and a plurality of different temperatures over the said range.

In this specification and claims the term "phase aligned" means that two signals are either in phase or in phase opposition.

Certain embodiments of the invention will now be described, by way of example, with reference to the accompanying drawings, in which:

Figure 1:
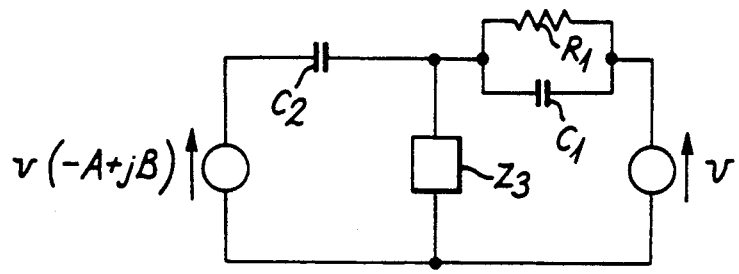
FIG. 1 is a circuit diagram of a bridge on which the present invention is based.

The invention is based on the two-voltage two-arm bridge of FIG. 1 which comprises a capacitor $C_1$ in parallel with a resistor $R_1$ which together at a current frequency represent the sample when placed between two electrodes. The other arm of the bridge is formed by capacitor $C_2$, and an impedance $Z_3$ formed by the input of a signal detector is connected between the junction of $C_1, R_1$ and $C_2$ and a common terminal. Preferably the impedance $Z_3$ is capacitive when it is represented by a capacitor $C_3$. The bridge can be balanced; that is the voltage across the impedance $Z_3$ can be made zero by applying first and second oscillatory voltages v and $v(-A+jB)$ at the respective ends of the bridge shown in FIG. 1. Thus to balance the bridge the values of A and B are adjusted until the voltage across the impedance $Z_3$ is zero, A and B being positive real numbers which represent respectively the amplitudes of the 180° component and the 90° component of the second oscillatory voltage between the second and common terminals relative to the amplitude of the first oscillatory voltage between the first and common terminals.

At balance
$$C_1 = S\epsilon' = AC_2 \qquad \text{equation (1)}$$

$$R_1 = \frac{1}{S\omega\epsilon''} = \frac{1}{B\omega C_2} \qquad \text{equation (2)}$$

and

-continued
$$\tan \delta = \epsilon''/\epsilon' = 1/\omega C_1 R_1 = B/A \qquad \text{equation (3)}$$

where S is a shape factor for the sample, $\epsilon = \epsilon' - j\epsilon''$ is its complex relative permittivity and $\omega$ is a current angular frequency. Equations (1) and (2) satisfy the condition for independent balance.

Figure 2:
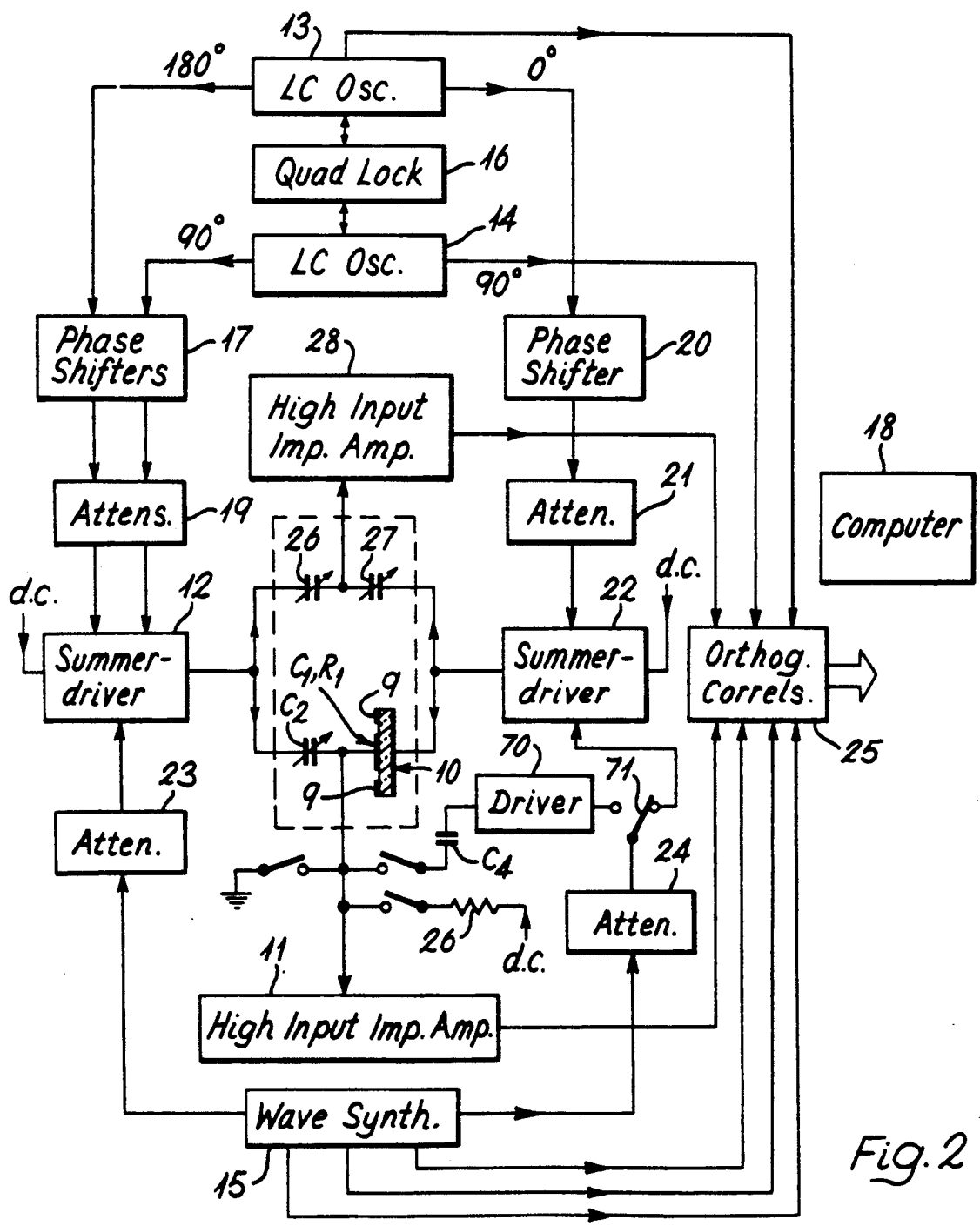
FIG. 2 is a block diagram of a bridge arrangement according to the invention.

FIG. 2 shows a block diagram of a practical bridge according to the invention where the sample corresponding to $C_1, R_1$ is shown at 10. The capacitor $C_2$ is made adjustable to accommodate a wide range of permittivity values for the sample so that convenient values of A and B can be obtained, and the impedance $Z_3$ is formed by the capacitive input of an amplifier 11. The impedance $Z_3$ is made comparable with or greater than the impedance of the capacitors $C_1$ and $C_2$ in parallel over the frequency range of the bridge. The voltage $v(-A+jB)$ appears at the output of a summer-driver circuit 12 with a low impedance output and is derived for high frequencies, about 20 kHz to 100 MHz, from two LC oscillators 13 and 14. For low frequencies, from about 20 kHz down to $10^{-5}$ Hz, the signal for the summer-driver 12 is derived from a digital waveform synthesizer 15.

An annular guard electrode 9 which may for example be connected to the common terminal of the bridge may be mounted on the left-hand side (as seen in FIG. 2) of an extension of the sample. The right-hand electrode (the electrode driven by the summer driver 22) is then extended to cover an area at least equal to the area of the opposite side of the sample bounded by the periphery of the guard electrode, so as to provide accurate definition of the sample.

The sample 10 and the capacitor $C_2$ are positioned in a chamber which can be cooled (to about $-180°$ C.) and heated (to about 400° C.) in order to allow the permittivity of samples to be measured at various temperatures. For this purpose the chamber is surrounded by coils of tubing fed by nitrogen gas at an appropriate controlled temperature.

The oscillators 13 and 14 which are described in more detail below are locked in phase quadrature by means of a circuit 16 so that three outputs of nominal phases 0°, 90° lead and 180° lead are obtained. The 90° lead and 180° lead outputs are applied to variable phase shifters 17 comprising, for example, short lengths of transmission line selected by a computer 18. The shortest line lengths may, for example, be equivalent to a minimum of 1 ns time shift. The computer 18 has control connections to most of the circuits of FIG. 2, but for clarity of the drawings these connections are omitted.

In order to provide variable attenuation of the signals from the oscillators 13 and 14 the phase shifters 17 are connected to stepper-driven wide-band turret attenuators shown as a block 19. These attenuators which are controlled by the computer 18 give up to 80 db attenuation in 0.1 db steps.

The nominal 0° output obtained from the oscillator 13 passes by way of phase shifter 20 and attenuator 21, of the same form as the phase shifters 17 and attenuators 19, to a summer-driver 22 also with low output impedance.

The phase shifters 17 and the attenuators 19 provide coarse adjustment for A and B. Fine adjustment is obtained from phase shifters and attenuators 37 (see FIG. 3) at the outputs of the oscillators 13 and 14 which allow incremental adjustments of amplitude in 0.01 db steps up to 0.2 db and of phase in 1 ps time steps up to 2 ns.

As is explained below the computer 18 controls attenuation and phase shift in the various circuits mentioned in response to the output of the bridge in order to achieve or predict balance.

The waveform synthesizer 15 which is under the control of the computer 18 generates output signals of variable amplitude in 0.002 db steps and of relative phase which is variable in 0.1° steps such that the resultant phase of the second oscillatory voltage relative to the first oscillatory voltage extends at least over the range between a lead of 90° and a lead of 180°. Attenuators 23 and 24 are connected between the outputs of the synthesizer and the summer-drivers 12 and 22 to provide coarse amplitude control. The synthesizer also provides two synchronising waveforms (for use as described later): one once per cycle and one at sampling-integrator intervals during each waveform.

In order to detect real and imaginary voltages at the input of the amplifier 11, two orthogonal correlators together shown at 25 correlate signals from the amplifier 11 with reference signals having nominal phases of 0° and 90° respectively from either the oscillators 13 and 14 or the waveform synthesizer 15 (which has two further outputs for this purpose). The correlators are not used at very low frequencies where correlation is, instead, carried out by the computer. The results of correlation are used by the computer to allow adjustment of phase and amplitude of the signal applied at the output of the summer-driver 12 to balance the bridge. This process is described in more detail below.

In some situations it is necessary to be able to measure the magnitude of the out-of-balance voltage from the bridges and for this reason the amplifiers 11 and 28 are also connected each to a magnitude detector (not shown).

Both summer-drivers 12 and 22 may receive an adjustable amplitude d.c., which may vary slowly, to allow the time average of the first and second oscillatory voltages to be adjusted to zero, if necessary, or to some other value as may be required to modify the charge balance within the bridge by this means. It is often desirable to control more specifically the charge within the sample and thereby to be able to clamp the d.c. potential difference across the sample to a predetermined value which may include zero. Charge injection for this purpose may be achieved for example by connecting one side of a resistor 26 in FIG. 2 by way of a switch to the junction of the sample 10 and the capacitor $C_2$, the other side being connected to a d.c. or slowly varying voltage which induces a charge flow through the resistor 26. The potential of the junction of the sample 10 and the capacitor $C_2$, and hence the potential difference across the sample 26, may be measured by a parametric means within the signal detector, and the measured value used to control the amplitude of the charge inducing d.c. voltage.

The accuracy of the bridge of FIG. 2 depends on known settings of the relative phase and amplitude of the outputs of the summer-drivers 12 and 22. Setting is carried out using a reference bridge connected in parallel with, and in close symmetrical proximity with, the bridge containing the sample 10 (the sample bridge). A procedure, described below, is followed which ensures that the relative amplitude and phase are correct as applied to the reference bridge and therefore as applied to the sample bridge. The reference bridge comprises adjustable capacitors 26 and 27 and an amplifier 28 whose input impedance is primarily capacitative at frequencies at which the reference bridge is used. The output of the amplifier 28 is correlated by the correlators 25 with the nominal 0° (or 180°) and 90° signals from the oscillators 13 and 14 or the waveform synthesizer 15. Adjustment of the capacitors 26 and 27 is again under computer control.

The use of the reference bridge is now described and as a first step it is necessary to calibrate the relative capacitance of the capacitors 26 and 27. The two outputs from the synthesizer 15 to the attenuators 23 and 24 are set to be in phase opposition at a frequency at which the amplitude characteristics of the waveform synthesizer outputs, the amplitude response of the attenuators 23 and 24 and the amplitude response of the summer-drivers 12 and 22 are not significantly different from their respective amplitude characteristics and amplitude responses at d.c. The relative amplitude of these voltages is set using the attenuators 23 and 24 and the synthesizer 15 to equal a required relative capacitance of the capacitors 26 and 27 which, as will be made clear shortly, is usually the value A from equation (1). The capacitors 26 and 27 and the phase of the two synthesizer output voltages are now adjusted to give zero out of balance as indicated by the output of the amplifier 28, thus setting the relative capacitance to the required value and taking account of any phase imperfections between the oscillatory voltages at the summer-driver outputs. This procedure may be repeated before the outputs of the summer drivers 12 and 22 are set to a particular value for a reading from the sample bridge to be taken or it may be repeated for a number of relative capacitance values of the capacitors 26 and 27, the settings of the attenuators 23 and 24 and the relative phase of the synthesizer outputs being recorded by the computer for further use.

The attenuators 23 and 24 can be calibrated in a conventional way using a d.c. signal and a voltmeter to measure input and output voltage.

Having calibrated the relative capacitances of the capacitors 26 and 27, voltages at the outputs of the summer-drivers 12 and 22 with required relative phase and amplitude can be set up as follows:

(a) The relative capacitance of the capacitors 26 and 27 is set to equal the required relative amplitude of the 0° voltage at the output of the summer-driver 22 and the 180° lead voltage at the output of the summer-driver 12 (this sets the value A).

(b) The amplitudes and phases of the 0° voltage and the 180° lead voltage are adjusted to give zero out-of-balance voltage as indicated by the output of the amplifier 28 (this ensures that these two voltages are in phase opposition and of relative amplitude A).

(c) The 0° voltage is removed, for example by disconnecting attenuator 21, and the output of the signal magnitude detector at the output of the amplifier 28 is measured. The 180° lead voltage is replaced by the 90° lead voltage and the attenuation means, including one of the attenuators 19, is adjusted to give comparable measured outputs at the signal magnitude detector (thus providing an amplitude datum to which subsequent settings of the 90° lead component may be referred).

(d) 0°, 90° lead and 180° lead voltages are applied to the reference bridge and the amplitude of the 90° lead voltage is adjusted using the attenuation means, including the attenuators 19, to give the required relative amplitude of A to B (this relies on the calibration carried out in (c) and, as far as the difference between A and B is concerned, an earlier calibration of the amplitude response of the attenuators 19 which may be carried out at d.c.).

(e) The output of the signal magnitude detector at the output of the amplifier 28 caused by the 0°, 90° lead and 180° lead voltages is measured. The 0° and 180° lead voltages are removed and the output of the signal magnitude detector caused by the 90° lead voltage alone is measured. The second measured magnitude is subtracted from the first measured magnitude.

(f) The capacitors 26 and 27 are readjusted and, for each new capacitance ratio, step (e) is performed until the result of the subtraction in step (e) is at a minimum (maximally negative). The deviation of the capacitance ratio at the minimum from its value corresponding to A is a measure of the phase error of the 90° lead component.

(g) The phase of the 90° lead component is corrected using the phase shifter 17 and the oscillator 14 while readjusting the capacitors 26 and 27 to the required relative value as originally set up in (a) (that is the value A).

The steps (e) to (g) are repeated as long as is necessary to obtain minimum magnitude out of balance at the required relative capacitance of the capacitors 26 and 27.

The above procedure is carried out by the computer and when complete it ensures that the voltages at the output of the summer-drivers 12 and 22 have the required relative amplitudes and phases to represent the coefficients $(-A+jB)$ and $+1$. The value of $C_2$ must be known if the permittivity is to be calculated accurately and although $C_2$ is calibrated its value may vary as, for example, temperature in the chamber containing the sample is varied. A standard capacitor $C_4$ outside the chamber is therefore connected through a driver circuit 70 to switch 71 which allows the output of the attenuator 24 to be connected either to the summer-driver 22 or the driver circuit 70.

To check the value of $C_2$, convenient voltages at a standardising frequency are applied to the capacitor $C_4$ and the capacitor $C_2$ from the synthesizer by way of the attenuators 23 and 24. The relative amplitude and phase of the signal through the attenuator 23 is adjusted to give bridge balance (that is with the capacitor $C_4$ in effect replacing the sample $C_1$, $R_1$) and the adjustment is used to calculate a correction factor for the capacitance of the capacitor $C_2$. The corrected value of $C_2$ is given by $$C_2 = \frac{C_4}{(A_4 - jB_4)}$$

where $A_4$ and $B_4$ are respectively the A and B values required for the said bridge balance.

Figure 3:
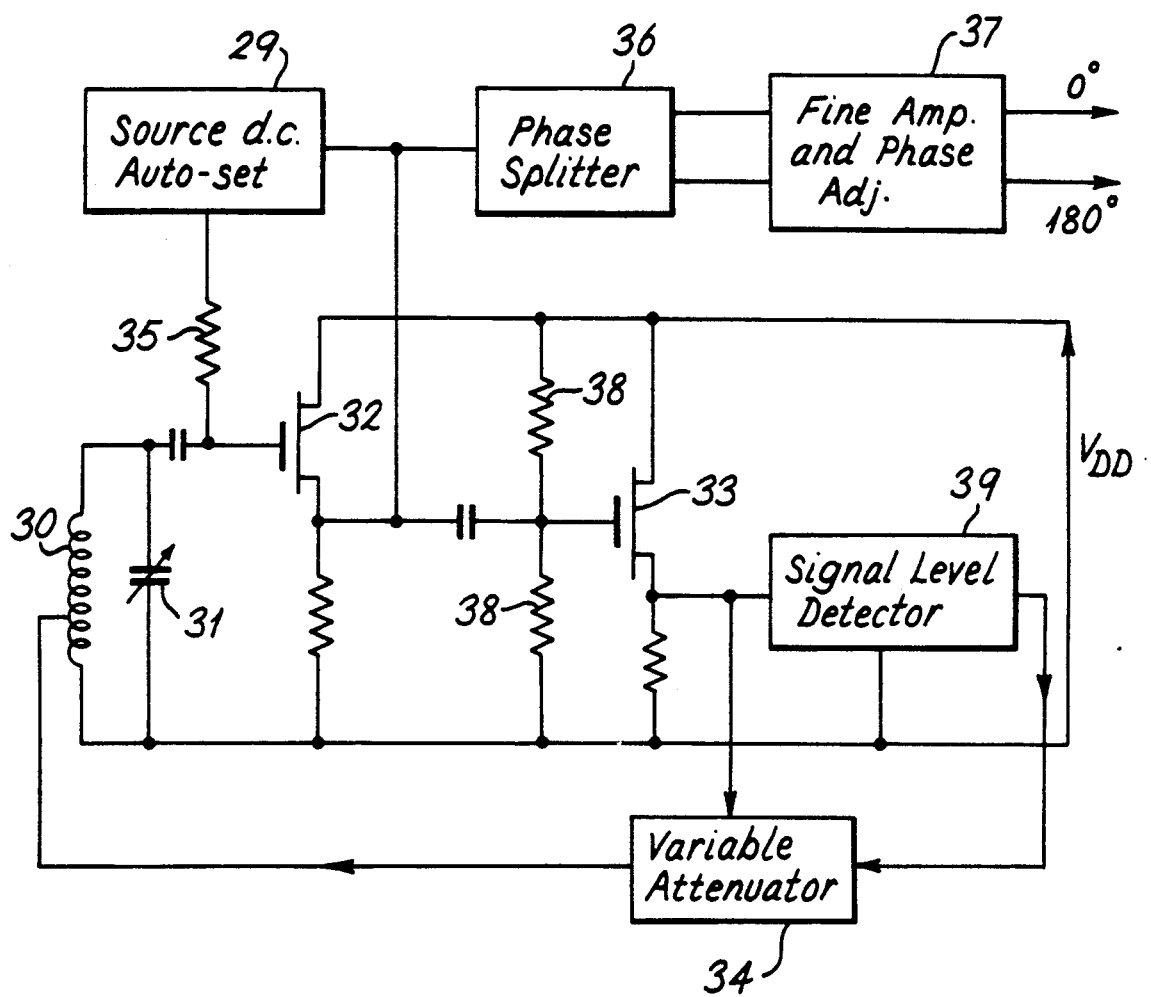
FIG. 3 is a circuit diagram of a variable oscillator used in the block diagram of FIG. 2.

Each of the LC oscillators 13 and 14 has the form shown in FIG. 3 where a parallel resonant circuit formed by an inductor 30 and a variable capacitor 31 controls the frequency of oscillation. In view of the form of this circuit the inductor 30 can be used over a frequency range in excess of 10 to 1 before an alternative inductor, one of a bank of switched inductors, is selected by the computer 18. The variable capacitor 31 is adjustable in three ways under the control of the computer since it is made up of three different types of capacitor: firstly a fixed capacitor in series with a varicap diode, secondly a motor driven variable capacitor and thirdly a group of fixed capacitors switched into circuit as required.

The resonant circuit is connected to two follower stages based on VMOS FETs 32 and 33, respectively, and positive feedback passes by way of a variable attenuator 34 having a current output from a resistive source to a voltage-enhancing tap on the inductor 30. This arrangement of resonant circuit ensures a singular frequency resonance behaviour with constant voltage enhancement over a wide range of the variable capacitor 31. The FET 32 is connected in the common drain configuration so that advantage can be taken of the inherent negative feedback of this configuration to provide a pure sinusoidal output. Correct bias for this purpose is arranged by means of the source-d.c. auto-set circuit 29 which is a time-averaged d.c. proportional loop, and the output from the oscillator is taken at the output of the FET 32 to a phase splitter 36 giving signals at nominal 0° and 180°. Attenuators and phase shifters in a circuit 37 connected to the phase splitter allow fine adjustment of the nominal 0° and 180° signals in response to signals from the computer. The other FET 33 is biassed by means of resistors 38 so that it operates in a non-linear region of its large-signal characteristic. Again the common drain configuration provides negative feedback and ensures a steady transitional fall in gain from the linear region of the output characteristic to a reducing gain non-linear region. As the amplitude of oscillations builds up the non-linear region is entered progressively where second harmonic and other harmonics are generated. The generation of these harmonics absorbs power fed back at the resonant frequency and the output amplitude is controlled to give a quasi sinusoidal output containing some harmonics. This form of operation is known as power shedding since some of the output power appears at the second and other harmonics. The FET 33 can be considered as providing a rapid response to variations in output amplitude but in order to provide correct voltage levels for overall operation the variable attenuator 34 is required in the feedback path. This attenuator is arranged to adjust the output of the second stage to have a constant time-averaged amplitude at the resonant frequency, thus providing long-term or long time constant stability.

The variable attenuator 34 is based on a PIN diode or a VMOS FET connected as a resistive-T attenuator, the PIN diode being used at high frequencies and the FET at low frequencies. For both devices the correct bias is obtained from a signal level detector 39 which generates a signal proportional to a time-average of the amplitude of the output of the FET 33.

The oscillator of FIG. 3 has the advantage that it provides low distortion sinusoidal outputs over a wide frequency range without change of inductor 30 while having both long-term and short-term stability.

The output of one of the oscillators 13 and 14 is coupled by way of the quadrature lock circuit 16 (see FIG. 2) to provide partial control for the capacitor 31 of the other oscillator. The quadrature lock circuit is a phase lock loop wherein the phase sensitive detector is a long tailed pair arrangement of three transistors in which the upper pair of transistors are switched alternately by one phase into respective load capacitors and the lower (tail) transistor receives the other phase, and the output of the detector is the voltage between the load capacitors.

In order that the balance detection sensitivity of the bridge of FIGS. 1 and 2 is maintained over the frequency band, it is necessary for amplifier 11 to have an input impedance which is larger than or comparable with the bridge arm impedances and which is primarily capacitative. If the junction between the sample capacitor and the capacitor $C_2$ were supported for example by a ceramic post then the resistance of this post would become significant at high temperatures, particularly for low frequencies where the impedance of the sample and the capacitor $C_2$ becomes very high, for example at frequencies of $10^{-5}$ Hz. Although a ceramic post can be used in some applications, in this critical situation the arrangement of FIG. 4 may be used to support the capacitor $C_2$ and the sample without the presence of a post in the high temperature chamber.

Figure 4:
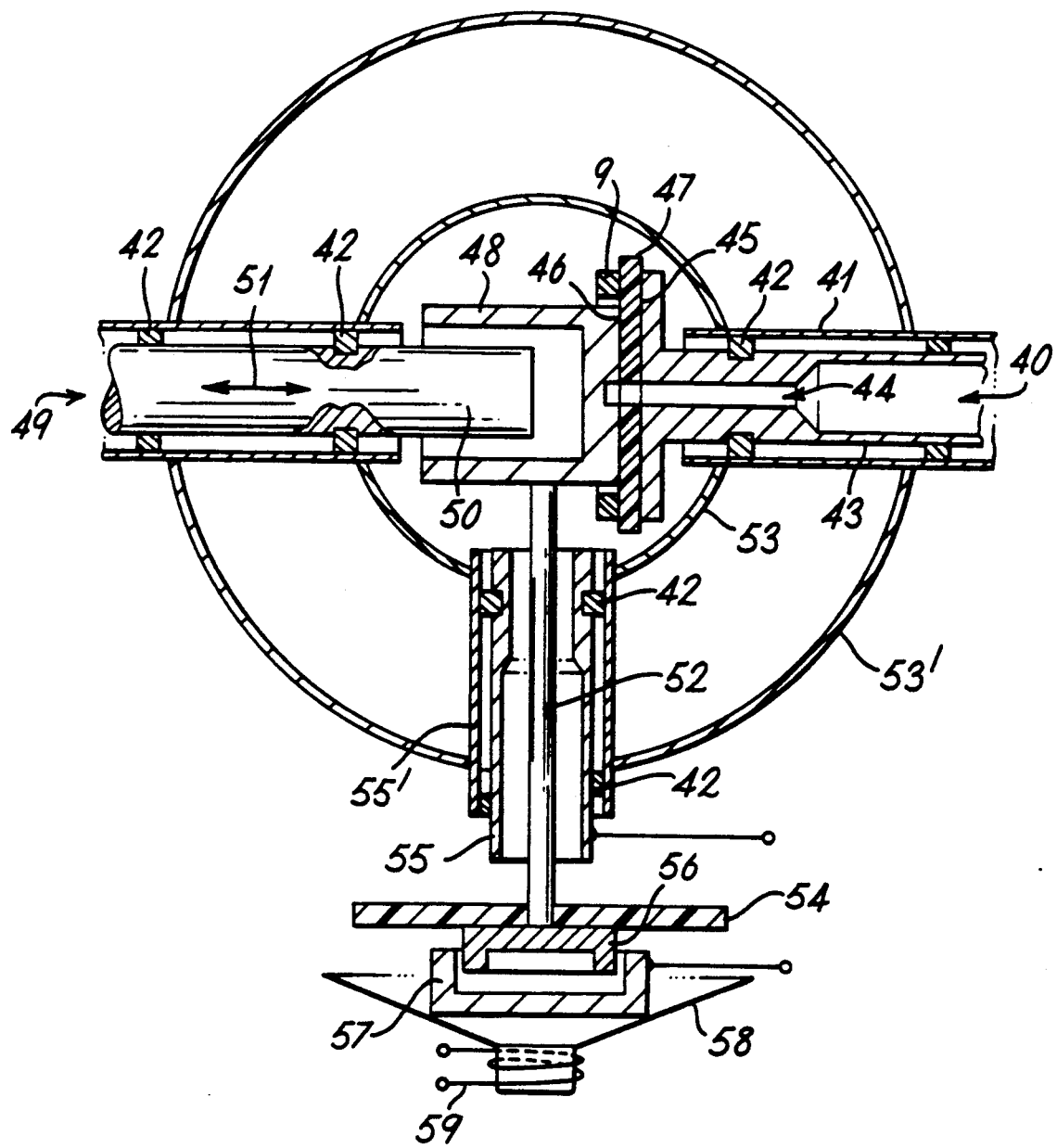
FIG. 4 shows practical details of sample support and capacitor configuration for the bridge of FIG. 2.

In FIG. 4 a coaxial line 40 corresponding to the right-hand connection from the summer driver 22 to the sample $C_1,R_1$ in FIG. 2 is of low characteristic impedance and is of length less than a quarter of a wavelength (measured in the line) at the highest frequency of permittivity measurement. The line 40 comprises an outer 41, insulating ring supports 42 and an inner 43 with a central duct 44 communicating with apertures in electrodes 45 and 46 for the sample 47. The electrode 45, which is an extension of the inner 43, has radial slots (not shown) extending to less than its radius which communicate with the duct 44 and allow a vacuum applied to the duct 44 to hold the sample 47 in place. The electrode 46 also has radial slots (not shown) extending to less than its radius which communicate with the duct 44 by way of a hole in the sample 47 and allow the electrode 46 and an extension 48 to the electrode 46 to be held in place by the vacuum in the duct 44. If required the guard electrode 9 may be used and is connected for example to the system structure representing the junction of the two oscillatory voltages. A rod 50 is an extension of the inner conductor of another coaxial line 49 having, as nearly as possible, the same physical and electrical properties as the line 40, and connecting the capacitor $C_2$ to the summer driver 12. The inner surface of the extension 48 forms one of the electrodes of the capacitor $C_2$, the other being the outer surface of the rod 50 which can be moved in the directions of the arrows 51 to vary the capacitance of $C_2$. The extension 48 also partly supports a rod 52 which extends out of the heating/cooling chamber, the heated or cooled inner boundary of which is indicated by the line 53 and the room temperature outer boundary of which is indicated by the line 53'. The rod 52 which forms a coaxial inner is further supported on a silica disc 54 whose outer edges are attached by clamps (not shown) to the system structure. The coaxial outer 55 is supported within an outermost coaxial tube 55' by the insulating rings 42. The rod 52 extends through the disc 54 to an electrode 56 which is one of the electrodes of a coupling capacitor at the input to the amplifier 11, the other being an electrode 57 which is supported by a loudspeaker cone indicated schematically at 58 and operated by a coil 59. Where inaccuracies in permittivity determination arise as a consequence of the hole in the sample 47, the hole may be omitted and the extension 48, the electrode 46 and the inner end of the rod 52 may be held in place by a second vacuum. For this purpose, the rod 52 is provided along its length with an axial duct (not shown) which, at its inner end, communicates by way of a second duct (not shown) in the extension 48 with the aperture in the electrode 46. A vacuum is applied to the duct at the outer end of the rod 52 by way of a silica tube (not shown) or other coupler of high electrical impedance.

Figure 5:
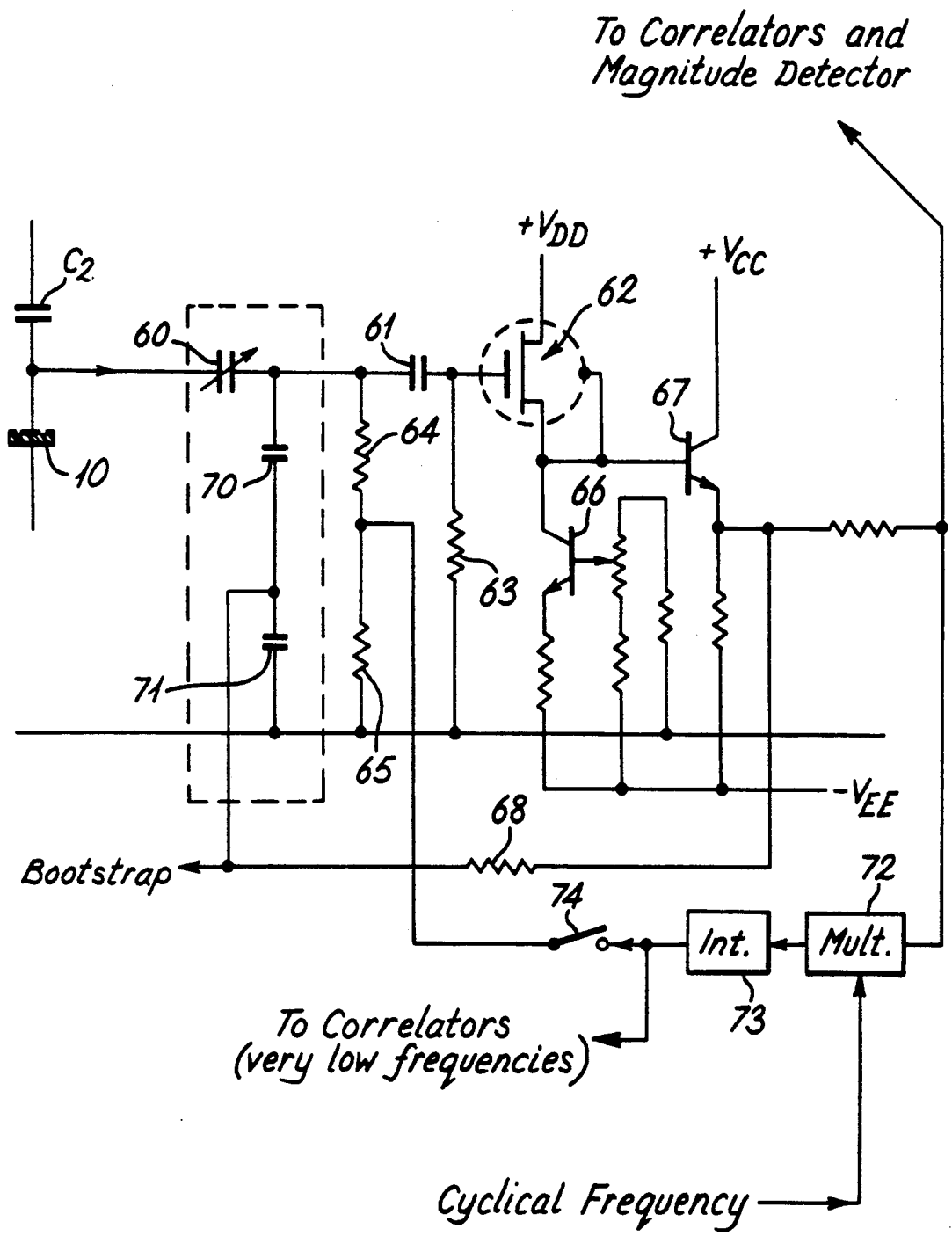
FIG. 5 is a circuit diagram of a capacitively coupled high input impedance signal amplifier used in FIG. 2.

A first stage suitable for the amplifier 11 is shown in FIG. 5 where an input coupling capacitor 60 is shown as variable since it takes the form shown in FIG. 4 with one electrode mounted on the loudspeaker cone 58. The coaxial line formed by the rod 52 and the outer 55 has a high characteristic impedance and is of length less than a quarter wavelength measured in the line at the highest frequency likely to be applied to the sample. At very low frequencies the signal appearing across the capacitor 60 would in other circumstances be regarded as d.c. but in this case the small variations in magnitude which take place are those required to provide an output signal. In order to provide amplification for these very low frequency variations a parametric amplifier is used in which a cyclical signal is applied to the loudspeaker coil, this being at a frequency significantly in excess of the highest very low frequency to be amplified parametrically and typically at 250 Hz. As a result a 250 Hz signal is amplitude modulated by the very low frequency signal and is then applied by way of a d.c.-blocking capacitor 61 to the input of an MOS field effect transistor 62 which with its bias resistor 63 has a parallel resistive component of input impedance of the order of $10^{11}$ ohms. As is mentioned below the d.c.-blocking capacitor 61 and bias resistor 63 are omitted in an alternative form of the amplifier 11 when the output of the amplifier 11 is used additionally to provide a bootstrap signal for general use at very low frequencies. The transistor 62 together with a transistor 66 forms a first follower stage coupled to a second (emitter) follower stage formed by a transistor 67. The two stages together have a non-inverting gain as near as possible to, but below, unity.

For frequencies above those at which the parametric amplifier is used, the output signal from the transistor 67 is passed to the correlators and the signal magnitude detector. This output signal is also used for bootstrapping to increase the input impedance and hence to decrease attenuation. For this purpose the signal at the emitter of the transistor 67 is taken by way of a low-value resistor 68 to the junction of capacitors 70 and 71 which represent the capacitance between the electrode mounted on the loudspeaker cone and the loudspeaker frame, and between the frame and earth, respectively, thereby increasing the effective impedance coupled to the signal path between the junction of the sample holder 10 and the capacitor $C_2$, and the gate of the field effect transistor 62, and providing the required increase in input impedance. More than one such impedance may be bootstrapped in this manner where stability criteria permit. For frequencies at which the parametric amplifier is used, the output from the transistor 67 is taken to a multiplier 72 which also receives a reference at the cyclical frequency, and phase-aligned with the output of the transistor 67, and the resulting product passes to an integrator 73. The integrator output is passed to the very low frequency correlators and is also applied by way of a switch 74 which is closed when the parametric amplifier is in use to a potentiometer formed by high and lower value resistors 64 and 65, respectively. Charge transfer through and across the resistor 64 allows the junction between the capacitor 60 and the resistor 64 to approach in amplitude and phase the voltage at the junction between the sample holder 10 and the capacitor $C_2$. An effect of the integrator is to increase the bootstrapping so provided with decrease in frequency. By this means the leakage resistance across the capacitor 60 of FIG. 5 can be increased typically from greater than $10^{13}$ ohms to better than $10^{18}$ ohms, and simultaneously the effective capacitance of the capacitor 60 at the current very low frequency is reduced. Provided, in the alternative form of amplifier 11, for use at very low frequencies, that the d.c.-blocking capacitor 61 is not included and therefore the resistor 63 is not required, the output from the emitter of the transistor 67 may also be applied by way of a switch, and through a unity gain d.c. amplifier where the load impedance so requires, to the outer 55 (see also FIG. 4) of the coaxial line between the extension 48 and the electrode 56 of FIG. 4. In this way a bootstrap arrangement is provided in which the potential difference between the outer 55 and the inner 52 feeding the capacitor 60 is considerably reduced. The output from the transistor 67 may also be used with the same arrangement to bootstrap any impedances coupled to the signal path between the junction to the capacitor $C_2$ and the sample holder 10, and the input to the capacitor 60. The bootstrap techniques of FIG. 5 and the alternative form of the amplifier 11 may also be used where it is decided to use a support for the junction of the capacitors $C_1$ and $C_2$ in the form of an insulator post which is divided into two parts one extending from the junction to a lower portion and the other extending from the lower portion to earth. The output of the transistor 67 is then connected to the lower portion, thereby providing a bootstrap. A support for the said junction may be appropriate where it is inconvenient to make a hole in the sample or to use one or both of the vacuum support systems.

A first stage suitable for the amplifier 28 may be constructed in the same way as shown in FIG. 5 as far as the transistors 62, 66, 67 and associated resistors, including resistor 63, are concerned. The remaining components shown in FIG. 5 are omitted if, as is usual, the reference bridge is not required to operate at very low frequencies.

An alternative first stage suitable for the amplifier 11 at all except the highest frequencies may be constructed in the same way as shown in FIG. 5 except that the transistors 62, 66, 67 and associated resistors and, where required the d.c.-blocking capacitor 61, are replaced by a multi-stage amplifier, which may be an operational amplifier, having a high open-loop gain and being provided with negative feedback such that the magnitude of its closed-loop voltage gain approaches very closely to unity, but does not exceed unity. The closeness of the closed-loop gain to unity provides a commensurate improvement in the effectiveness of bootstrapping. A first stage suitable for the amplifier 28 at all except the highest frequencies may be constructed similarly.

The output signal from the amplifiers 11 and 28 is, as has been mentioned, applied to two correlators 25 which receive nominally orthogonal reference signals at the signal frequency, or applied to the computer for correlation. Correlation is in three different forms for different frequency ranges, the appropriate form being selected by the computer 18. For each frequency range the cross correlation function used is $$\int_0^t v_{ref} \times v_{sig} \, dt$$

where t is an integral number of signal periods, or an approximation thereto where the number of cycles being correlated is large, $v_{ref}$ is one or other of the nominally orthogonal reference voltages and $v_{sig}$ is the signal from one of the amplifiers 11 or 28.

In the medium frequency range for example from about 0.1 Hz to 20 kHz multiplication is carried out by a commercially-available analogue-multiplier integrated circuit with output connected by way of an analogue switch, acting as a switch, to an integrator. The switch is periodically closed for a fixed number of cycles so that the product is accumulated in the integrator. The voltage across the capacitor is measured using a high precision digital voltmeter, the output being passed to the computer 18.

For high frequencies above 20 kHz the analogue multiplier is replaced by a commercially-available balanced modulator and the integrator is replaced by an RC time constant.

At lower frequencies, typically below 0.1 Hz, correlation is carried out by the computer 18 but first the signal voltage is sampled using the sampling synchronising output of the synthesizer by a circuit (not shown) comprising an analogue switch which applies the relevant signal to an integrator connected to the input of a digital voltmeter. Typically the analogue switch is closed for a period of about 1 second for a low frequency signal having a period of about 100 seconds so that an average voltage, that is a partial integral, is formed by the integrator over this period. Preferably two integrator circuits of this type are provided and the analogue switches of the two circuits are operated alternately so that one of the integrator circuits always provides a signal for the digital voltmeter and hence for the computer. Subsequently, after one or more complete periods of the low frequency as indicated by the once-per-cycle synchronising output of the synthesizer, orthogonal correlations at the signal frequency are performed by a Fourier analysis. The partial integrals can be considered as providing amplitude samples of the low frequency waveform. In its simplest form the analysis involves a first and a second summation of products giving respectively effective orthogonal correlation outputs $V_1$ and $V_2$. In the first summation each product is the result of multiplying a partial integral with an integral over the same time interval of a computer generated sine function at the signal frequency. In the second summation each product is the result of multiplying a partial integral with an integral over the same time interval of a computer generated cosine function at the signal frequency.

For all frequencies the two correlator outputs may be described by the linear equations:

$$V_1 = [(A'-A)K_1 + (B'-B)L_1]V \qquad \text{equation (4)}$$

$$V_2 = [(A'-A)K_2 + (B'-B)L_2]V \qquad \text{equation (5)}$$

where V is the amplitude of the first oscillatory voltage, $K_1$, $L_1$, $K_2$, $L_2$ are functions of all bridge impedances and relevant detector parameters, and $A'$, $B'$ are respectively the amplitudes of the 180° lead and 90° lead components of the second oscillatory voltage relative to the first oscillatory voltage.

In order to evaluate $K_1$, $L_1$, $K_2$, $L_2$, A, B it is necessary to take readings of $V_1$ and $V_2$ for three different pairs of $A'$, $B'$ values with the proviso that starting with an initial pair of values, the other two pairs are not found by adjusting the 180° lead and 90° lead signals to give changes which are in phase alignment.

In practice it is usually convenient to make equal increases in the 180° lead and 90° lead signal amplitudes using the attenuators 19 and the oscillators 13 and 14, from an initial setting. In this way, with a restricted dynamic range at the detector, the maximum excitation of K and L responses can be applied alternately.

If $V_{1C}$, $V_{1N}$ and $V_{1E}$ are the values of $V_1$ obtained in each case (C, N and E), $V_{1C}$ being the initial value of $V_1$, $V_{1N}$ and $V_{1E}$ being values of $V_1$ correpsonding to the other two settings, then $$V_{1N} - V_{1C} = [(A'_N - A'_C)K_1 + (B'_N - B'_C)L_1]V \quad \text{equation (6)}$$

$$V_{1E} - V_{1C} = [(A'_E - A'_C)K_1 + (B'_E - B'_C)L_1]V \quad \text{equation (7)}$$

These are two linear equations in $K_1$, $L_1$ which are readily solved. $K_2$ and $L_2$ are similarly obtained from $V_{2C}$, $V_{2N}$, $V_{2E}$. By substituting these K, L values into equations (4) and (5) for C, N or E cases (typically the one nearest balance), two equations in A, B are obtained which are readily solved. Substitution into equations (1) and (2), and knowing $C_2$, then yields $C_1$ and $R_1$ values respectively.

Having predicted the balance point using the above method actual balance can be attempted using the values of A and B found. Even if exact balance does not occur each new reading of $V_1$, $V_2$ will produce a $C_1$, $R_1$ value by solving equations (4) and (5) as before using the known K,L values.

When the correlators are implemented in software, the two correlators vary only in that their reference signals are orthogonal, that is $K_1 = L_2$ and $K_2 = -L_1$. In this case only two pairs of values of $V_1$ and $V_2$ are required.

If these pairs of values are $V_{1V}$, $V_{2V}$ and $V_{1C}$, $V_{2C}$, then $$V_{1V} - V_{1C} = [(A'_V - A'_C)K_1 + (B'_V - B'_C)L_1]V \quad \text{equation (8)}$$

$$V_{2V} - V_{2C} = [-(A'_V - A'_C)L_1 + (B'_V - B'_C)K_1]V \quad \text{equation (9)}$$

which are readily solved for $K_1$, $L_1$ and hence $K_2$, $L_2$ from which A, B and hence $C_1$, $R_1$ are computed as before.

The following procedure may be used to adjust for phase and relative amplitude offsets when using the synthesizer 15 to supply the bridge:

(a) Set the capacitors 26 and 27 of the reference bridge to a known convenient ratio $\eta = C_{27}/C_{26}$ (for example $\eta = 1$), (b) Apply signals to the summer drivers 12 and 22 from the synthesizer at the current frequency of measurement, (c) Balance the reference bridge using the above procedure which involves finding pairs of values $V_{1C}$, $V_{2C}$ and $V_{1N}$, $V_{2N}$ and $V_{1E}$, $V_{2E}$ and record the balance conditions $A_{REF}$, $B_{REF}$, (d) Balance the sample bridge using the above procedure which involves finding pairs of values $V_{1C}$, $V_{2C}$ and $V_{1N}$, $V_{2N}$ and $V_{1E}$, $V_{2E}$ and record the balance conditions $A_{SAM}$, $B_{SAM}$, and (e) Obtain corrected A and B values given by $$A = \eta \left[ \frac{A_{SAM} A_{REF} + B_{SAM} B_{REF}}{A_{REF}^2 + B_{REF}^2} \right] \quad \text{equation (10)}$$

-continued $$B = \eta \left[ \frac{B_{SAM} A_{REF} - A_{SAM} B_{REF}}{A_{REF}^2 + B_{REF}^2} \right] \quad \text{equation (11)}$$

Three algorithms which can be used in programming the computer 18 are now given to show operation of the apparatus of FIG. 2 in different circumstances.

Figure 6:
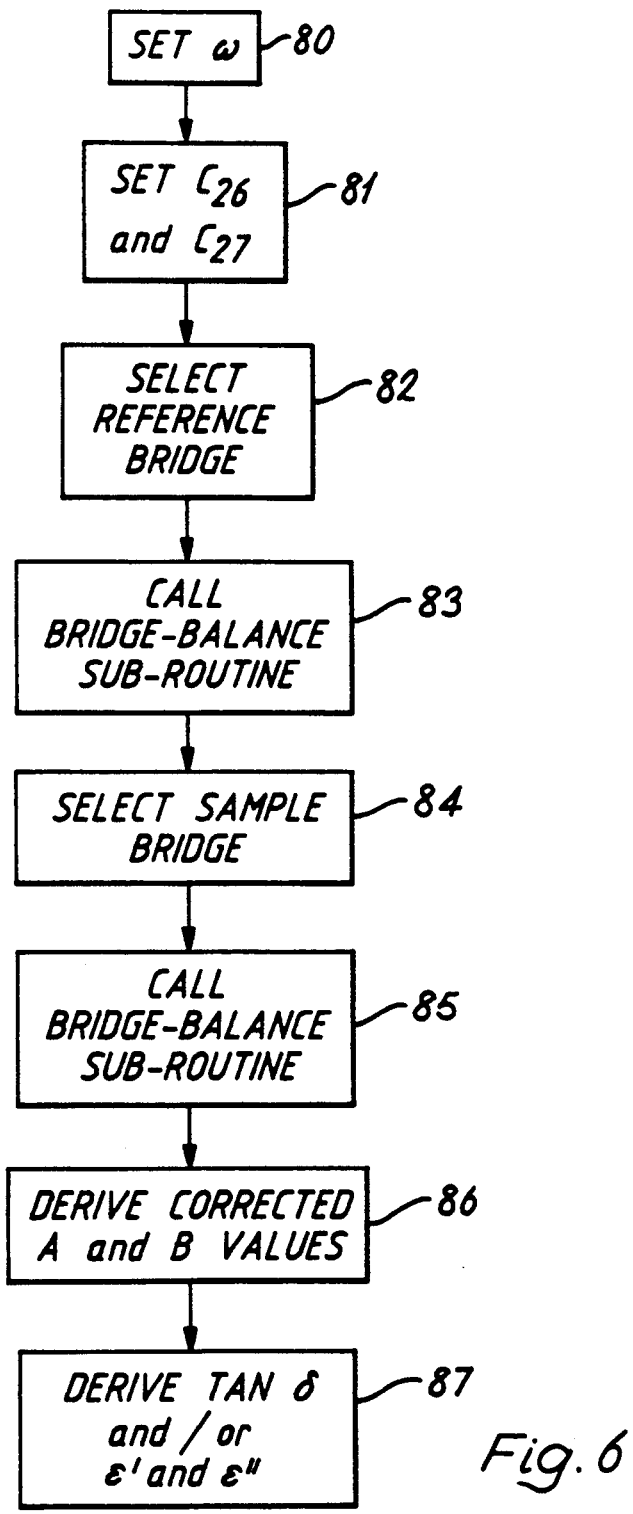
FIG. 6 is a flow chart showing a first bridge balance algorithm which is generally applicable.
Figure 7:
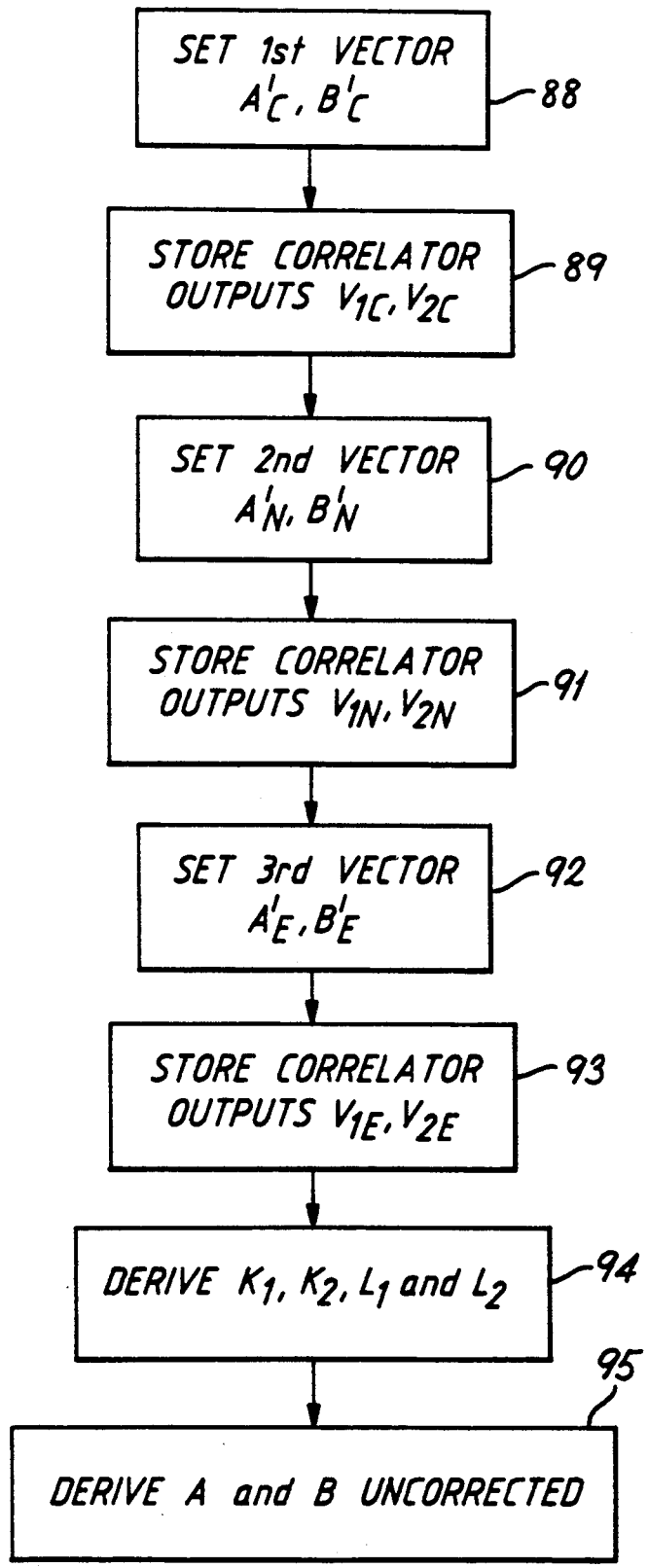
FIG. 7 is a flow chart of a sub-routine forming part of the first algorithm.

The first of these algorithms is shown in FIGS. 6 and 7 and listed in more detail below. It is generally applicable but usually employed over that frequency range in which the synthesizer 15 is used but the parametric part of the amplifier 11 is not.

The first algorithm is as follows:

1. Set measurement angular frequency $\omega$ (operation 80 in FIG. 6).
2. Set the reference bridge capacitors $C_{26}$, $C_{27}$ to a convenient known ratio $\eta = C_{27}/C_{26}$ (normally 1) (operation 81).
3. Select reference bridge correlation (operation 82).
4. Implement the bridge-balance sub-routine and store the balance conditions A, B as $A_{REF}$, $B_{REF}$—see FIG. 7 (operation 83).
5. Select sample bridge correlation (operation 84).
6. Implement the bridge-balance sub-routine and store the balance conditions A, B as $A_{SAM}$, $B_{SAM}$ (operation 85).
7. Use $A_{REF}$, $B_{REF}$ and $A_{SAM}$, $B_{SAM}$ and $\eta$ as data in equations (10) and (11) to obtain corrected A and B values (operation 86).
8. Use corrected A, B values as data in equation (3) to obtain tan $\delta$, or in equations (1) and (2) to obtain sample permittivity components $\epsilon'$, $\epsilon''$ knowing S, $\omega$ and $C_2$ (operation 87).

The bridge balance sub-routine of FIG. 6 is shown in FIG. 7 and is as follows:

1. Set a first pair of values $A'_C$, $B'_C$ (operation 88).
2. Store the consequent correlator outputs $V_{1C}$, $V_{2C}$ (operation 89).
3. Set a second pair of values $A'_N$, $B'_N$ such that the vector $A'_N$, $B'_N$ is not zero or equal to the vector $A'_C$, $B'_C$ (operation 90).
4. Store the consequent correlator outputs $V_{1N}$, $V_{2N}$ (operation 91).
5. Set a third pair of values $A'_E$, $B'_E$ such that the vector $(A'_E - A'_C)$, $(B'_E - B'_C)$ is not zero or phase-aligned with the vector $(A'_N - A'_C)$, $(B'_N - B'_C)$ (operation 92).
6. Store the consequent correlator outputs $V_{1E}$, $V_{2E}$ (operation 93).
7. Use $V_{1C}$, $V_{1N}$ and $V_{1E}$ as data in equations (6) and (7) to obtain $K_1$, $L_1$ and use $V_{2C}$, $V_{2N}$ and $V_{2E}$ as data in the corresponding pair of equations to obtain $K_2$, $L_2$ (operation 94).
8. Use the values $K_1$, $L_1$, $K_2$, $L_2$ as data in equations (4) and (5) to give (uncorrected) A, B values (operation 95).

Figure 8:
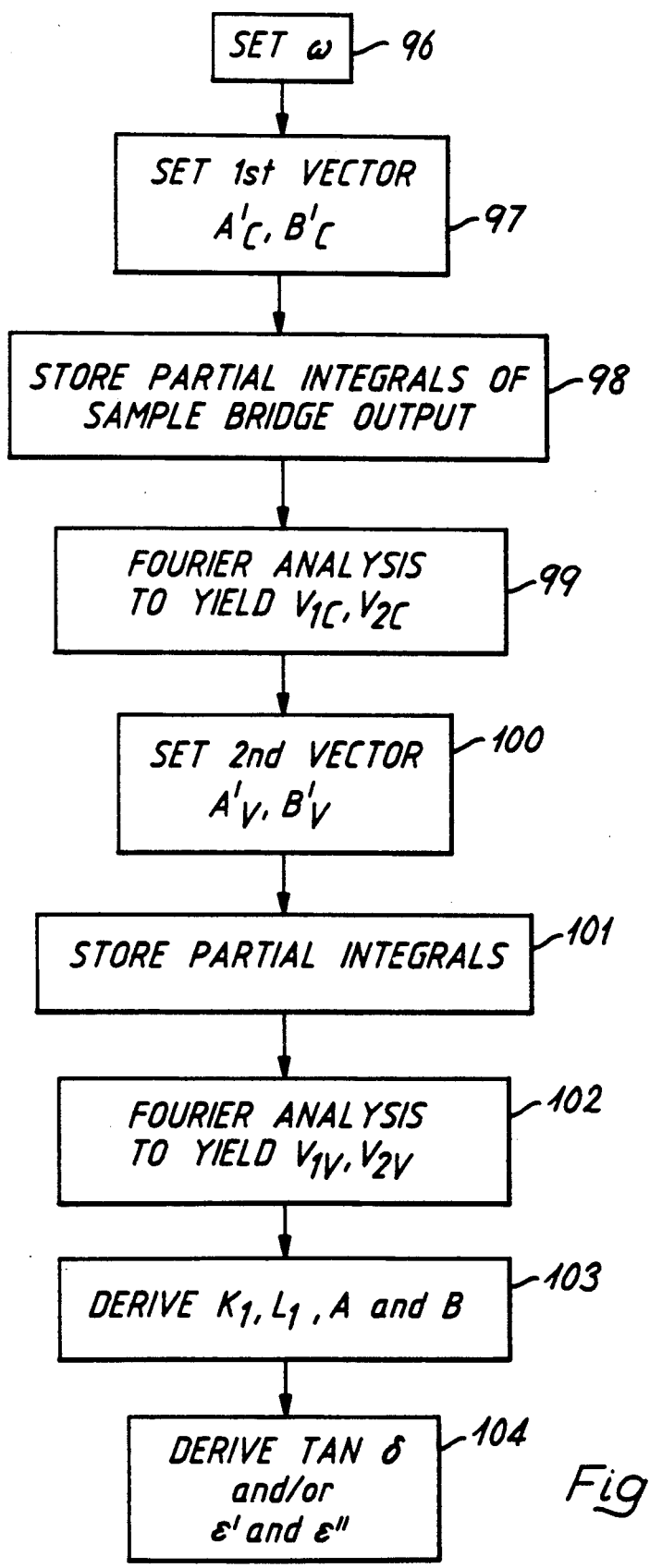
FIG. 8 is a flow chart showing a second bridge balance algorithm which is particularly appropriate where the reference bridge is not used and software correlation is involved, such as at very low frequencies, and FIGS. 9a, 9b and 9c form a flow chart showing a third bridge balance algorithm which is particularly appropriate where bridge drive voltages are constructed by a summation of primary phases.

The second algorithm is shown in FIG. 8 and is particularly appropriate where the reference bridge is not used and software correlation is involved, such as at very low frequencies. The second algorithm is as follows:

1. Set measurement angular frequency $\omega$ (operation 96).
2. Set a first pair of values $A'_C$, $B'_C$ (operation 97).
3. Store a set of partial integrals representing the output from the sample bridge amplifier for a convenient time (normally an integer multiple of $2\pi/\omega$) (operation 98).

4. Perform a Fourier analysis on the set of partial integrals obtained in step 3 to yield components $V_{1C}$, $V_{2C}$ at $\omega$ (operation 99).

5. Set a second pair of values $A'_V$, $B'_V$ such that the vector $A'_V$, $B'_V$ is not phase-aligned with vector $A'_C$, $B'_C$ (operation 100).

6. Store a set of partial integrals representing the output from the sample bridge amplifier for a convenient time (normally an integer multiple of $2\pi/\omega$) (operation 101).

7. Perform a Fourier analysis on the set of partial integrals obtained in step 6 to yield components $V_{1V}$, $V_{2V}$ at $\omega$ (operation 102).

8. Use $V_{1C}$, $V_{2C}$ and $V_{1V}$, $V_{2V}$ as data in equations (8) and (9) to extract $K_1$, $L_1$ values and, hence, in equations (4) and (5) with $K_1 = L_2$ and $K_2 = -L_1$ to give A and B values (operation 103).

9. Use A, B values as data in equation (3) to obtain tan δ, or in equations (1) and (2) to obtain sample permittivity components $\epsilon'$, $\epsilon''$ knowing S, $\omega$ and $C_2$ (operation 104).

Figure 9A:
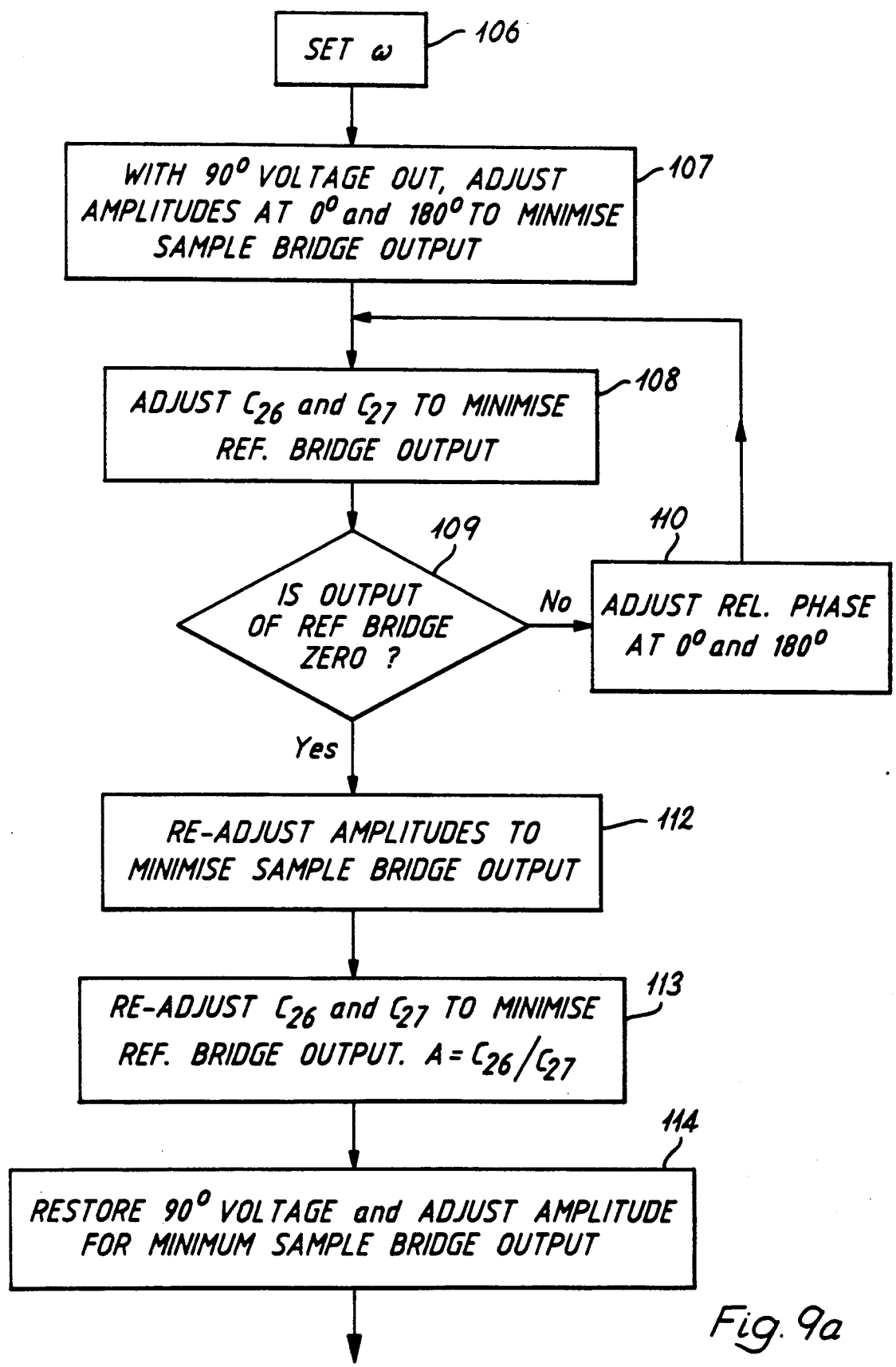
Figure 9B:
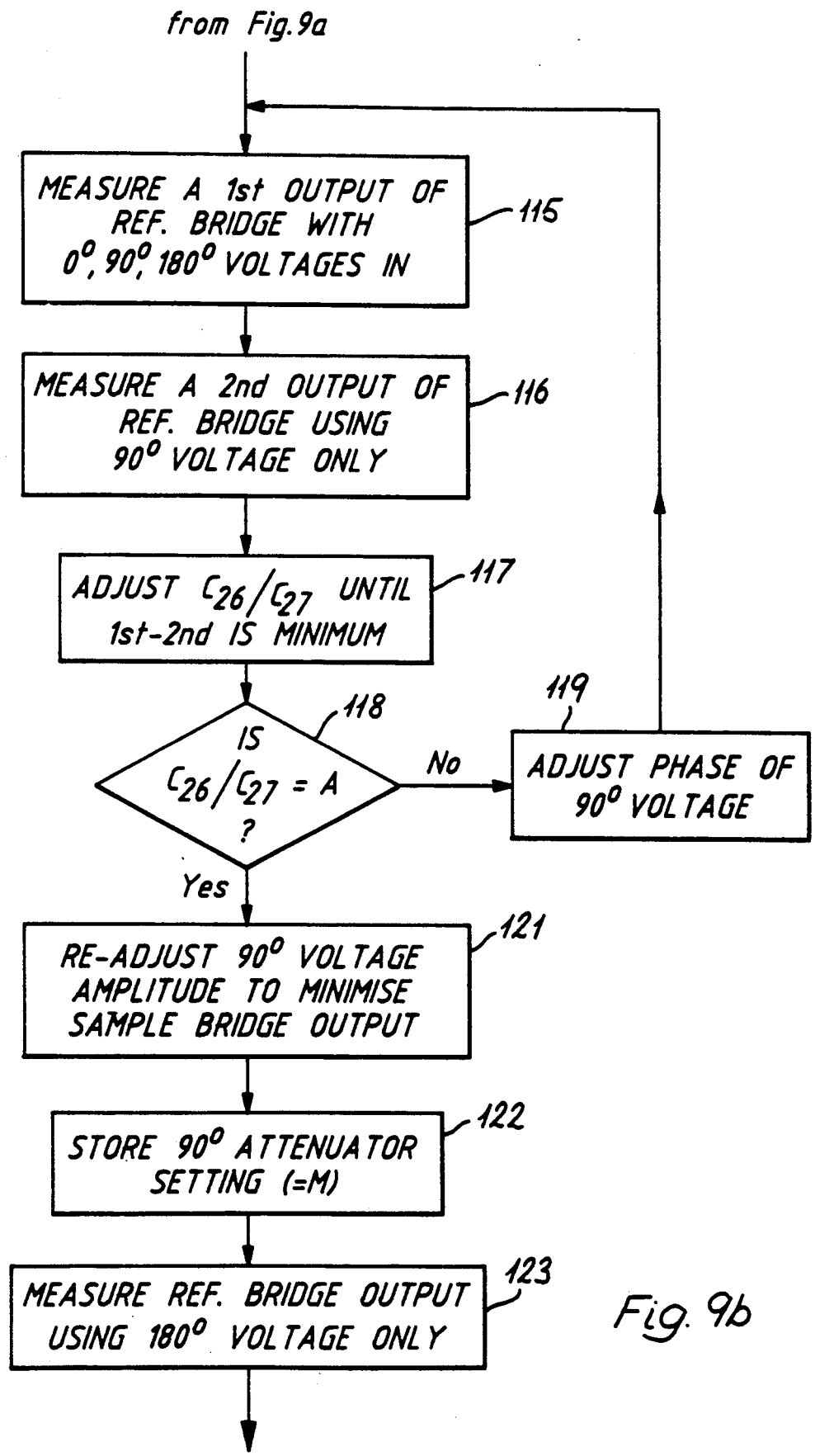
Figure 9C:
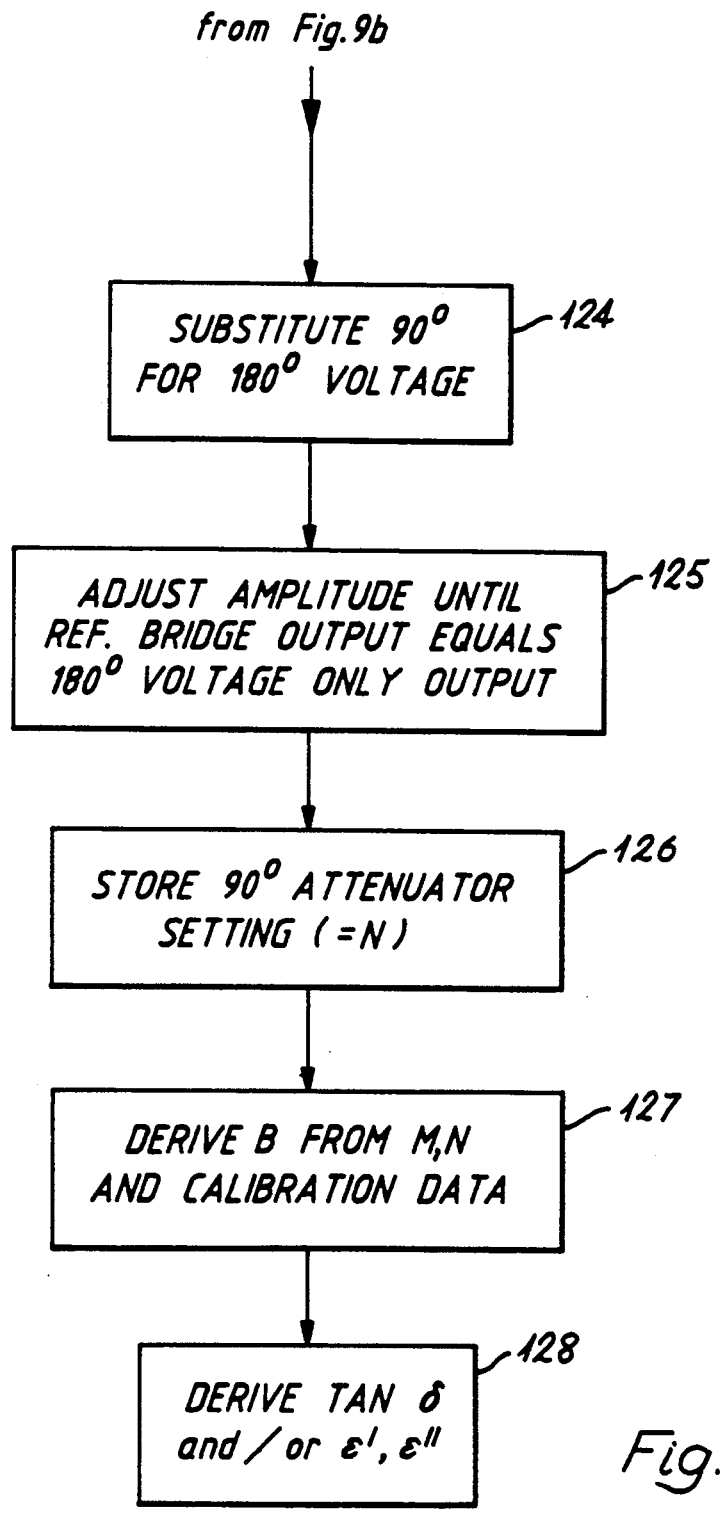

The third algorithm (shown in FIGS. 9a, 9b and 9c) is appropriate when the oscillators 13 and 14 are used and the bridge drive voltages are constructed by a summation of primary phases, for example at frequencies above 20 kHz. The third algorithm is as follows:

1. Set measurement angular frequency $\omega$ (operation 106).

2. Remove the 90° lead voltage. Adjust the amplitudes of the 0° and 180° lead voltages to minimise the magnitude of the output from the sample bridge amplifier (operation 107).

3. Adjust the reference bridge capacitors $C_{26}$, $C_{27}$ to a ratio which minimises the magnitude of the output from the reference bridge amplifier (operation 108).

4. Is the magnitude of the output from the reference bridge amplifier zero? (test 109)

5. If "No": Adjust relative phase of the 0° and 180° lead voltages and return to 3 (operation 110).

6. If "Yes": Readjust, if necessary, the amplitude of the now correctly-phased 0° and 180° lead voltages to minimise the magnitude of the output from the sample bridge amplifier (operation 112).

7. Readjust, if necessary, the reference bridge capacitors $C_{26}$, $C_{27}$ to a ratio which minimises the magnitude of the output from the reference bridge amplifier. The value A is the capacitor ratio $C_{27}/C_{26}$ (operation 113).

8. Add the 90° lead voltage and adjust its amplitude to minimise the magnitude of the output from the sample bridge amplifier (operation 114).

9. Measure a first magnitude of output from the reference bridge amplifier caused by the 0°, 90° lead and 180° lead voltages together (operation 115).

10. Remove the 0° and 180° lead voltages. Measure a second magnitude of output from the reference bridge amplifier caused by the 90° lead voltage alone (operation 116).

11. Subtract the second magnitude from the first magnitude. Increment, or decrement, the reference bridge capacitor ratio successively until the subtraction is a minimum (maximally negative) (operation 117).

12. Is the reference bridge capacitor ratio at the subtraction minimum equal to A? (test 118)

13. If "No": Adjust the phase of the 90° lead voltage and return to 9 (operation 119).

14. If "Yes": Readjust, if necessary, the amplitudes of the now correctly-phased 90° lead voltage using the 90° attenuator to minimise the magnitude of the output from the sample bridge amplifier (operation 121).

15. Store the 90° attenuator setting M (db) (operation 122).

6. Remove the 0° and 90° lead voltages and measure the magnitude of the output from the reference bridge amplifier caused by the 180° lead voltage alone (operation 123).

17. Replace the 180° lead voltage by the 90° lead voltage (operation 124).

18. Adjust the amplitude of the 90° lead voltage using the 90° attenuator until the magnitude of the output of the reference bridge amplifier caused by the 90° lead voltage alone is equal to the magnitude of the output caused by the 180° lead voltage alone (operation 125).

19. Store the 90° attenuator setting N (db) (operation 126).

20. Use the 90° attenuator calibration data to convert M, N to corrected linear voltage transfer ratios m, η respectively. The B value is given by $B = (m/n) A$ (operation 127).

21. Use A, B values as data in equation (3) to obtain tan δ, or in equations (1) and (2) to obtain sample permittivity components $\epsilon'$, $\epsilon''$ knowing S, $\omega$ and $C_2$ (operation 128).

The invention can be put into practice in many other ways than those specifically described above. For example other methods of applying voltages to the bridge may be used as may other detector amplifiers.

For the study of coupled dielectric processes, two pairs of voltages, each pair at a different frequency, may be applied simultaneously to the bridge. For this purpose the oscillators 13 and 14, the quad lock circuit 16, the phase shifters 17 and 20, the attenuators 19, 21, 23 and 24, the wave synthesizer 15, and the correlators 25 may be duplicated. The duplicate oscillators or the duplicate synthesizer simultaneously supply a different frequency from the oscillators 13 and 14 or the synthesizer 15. The correlators 25 receive reference signals at one of the frequencies and their duplicates receive reference signals at the other frequency so that out-of-balance signals at the two frequencies are produced which can be used in finding permittivities of the samples at the two frequencies. If required further duplicates may be added so that measurements at multiple simultaneous frequencies can be made.

Hitherto, the ratio of the oscillatory voltages at bridge balance has been described by $(-A + jB)$ where A, B are real and positive corresponding to a capacitative sample with a degree of resistive loss. However, it is possible to use the bridge to measure the impedance of a sample which has an inductive component, where the balance conditions are described by $(A + jB)$. In the latter case it is necessary to substitute a 0° voltage for the 180° lead voltage at the input to the balance arm summer-driver 12.

I claim:

1. Apparatus for determining the permittivity of samples of material comprising first, second, third and common terminals, a sample holder having two electrodes which together with a sample of material, when present, form a first capacitor connected between the first and third terminals, a second capacitor having no significant resistive or inductive component of impedance over a predetermined frequency band in which permittivity measurements are to be made using the apparatus, connected in between the second and third terminals, means for generating two oscillatory voltages at the same frequency, each adjustable over a wide frequency range, a first oscillatory voltage coupled between the first and common terminals, and a second oscillatory voltage coupled between the second and common terminals, said generating means having source impedances for said two voltages which are low compared with impedances between the first and common terminals, and between the second and common terminals, respectively, means for adjusting relative phases and amplitudes of said first and second oscillatory voltages before application to said terminals and for providing a precise indication of said relative phases and amplitudes, and a signal detector connected between the third and common terminals, and having an input impedance such that an out-of-balance signal can be detected allowing balance between voltages between the third and common terminals due to the first and second voltages, whereby the complex permittivity of the sample at a current frequency of the said voltages can be calculated from the said relative amplitude and phase at balance.

2. Apparatus according to claim 1 wherein the means for generating oscillatory voltages comprises a first variable frequency oscillator, having first and second outputs with the second output leading the first in phase by 180°, a second variable frequency oscillator, and means for locking the first and second oscillators in phase quadrature with the output of the second oscillator leading the first output of the first oscillator in phase by 90°, and wherein the means for adjusting the relative phase and amplitude of the two voltages comprises a first series combination of phase shift means and attenuators, from which one of the said oscillatory voltages for application between the first and common terminals is obtained, connected to the first output of the first oscillator, a second series combination of phase shift means and attenuators connected to the second output of the first oscillator, a third series combination of phase shift means and attenuators connected to the output of the second oscillator, means for summing the outputs of the second and third series combinations to provide the other of the said oscillatory voltages for application between the second and common terminals.

3. Apparatus according to claim 1 wherein the means for generating two oscillatory voltages comprises a single oscillator, means for providing three outputs from the oscillator with the second leading the first by 180° and the third leading the first by 90°, a first series combination of phase shift means and attenuators, from which one of the said oscillatory voltages is obtained, connected to receive the first output of the oscillator, second and third series combinations of phase shift means and attenuators connected to receive the second and third outputs of the oscillator, respectively, and means for summing the outputs of the second and third series combinations to provide the other of the said oscillatory voltages.

4. Apparatus according to claim 1 including first injection means coupled to the means for adjusting relative phase and amplitude and arranged to ensure that the first and second oscillatory voltages have a time average of a desired value.

5. Apparatus according to claim 4 including second injection means coupled to the third terminal and arranged to ensure that the voltage between the third and common terminals has a time average of zero or a desired non-zero value.

6. Apparatus according to claim 1 wherein the means for generating oscillatory voltages includes a waveform synthesizer for generating the oscillatory voltages at frequencies below a predetermined frequency.

7. Apparatus according to claim 6 wherein the waveform synthesizer has first and second outputs of variable relative phase and the apparatus includes first and second attenuators coupled to the first and second synthesizer outputs, respectively, for providing the first and second oscillatory voltages below the said predetermined frequency, and the phase of the second oscillatory voltage relative to the first oscillatory voltage is variable at least between a lead of 90° and a lead of 180°.

8. A method of determining the permittivity of a sample of material over a frequency band, comprising the steps of forming a first capacitor with a sample as dielectric, connecting a second capacitor having no significant resistive or inductive component of impedance over said band, in series with the first capacitor between first and second terminals, generating two oscillatory voltages at the same frequency and applying a first of the oscillatory voltages between the first terminal and a common terminal, and a second of the oscillatory voltages between the second terminal and the common terminal, using a signal detector to obtain an indication of an amount of out-of-balance voltage between a third terminal between the first and second capacitors and the common terminal, determining values of the relative phase and amplitude of the said two voltages which give zero out-of-balance voltage and calculating the complex permittivity of the sample at the said frequency from the values determined.

9. Apparatus according to claim 1 wherein the means for generating oscillatory voltages includes an oscillator comprising an inductor and capacitance means connected as a parallel resonant circuit having a variable resonance frequency, a first amplifier stage coupled to the resonant circuit, forming a voltage follower and providing a sinusoidal output voltage at the resonance frequency with no significant harmonic content, a second amplifier stage coupled to the first stage and providing an output at the resonance frequency but containing significant harmonics, the second amplifier stage having a magnitude of large-signal voltage transfer function decreasing progressively with amplitude of input voltage thereby providing fast amplitude limiting by power shedding, and an attenuator providing positive feedback from the second stage to a voltage enhancing tap on the inductor, the attenuator including means for controlling attenuation in dependence upon a time-averaged amplitude of an output of the first or the second stage so as to provide a constant adjustable said time averaged amplitude at the resonance frequency.

10. Apparatus according to claim 1 including a reference bridge comprising two variable further capacitors connected in series between the first and second terminals and a further signal detector connected between a fourth terminal between the further capacitors and the common terminal, each further capacitor having no significant resistive or inductive component of impedance over a predetermined frequency band in which permittivity measurements are to be made.

11. Apparatus according to claim 1 wherein the signal detector connected to the third terminal includes a coupling capacitor connected to the third terminal by way of a coaxial line of length significantly less than a quarter of a wavelength measured in the line at the highest frequency at which permittivity is to be measured, means for cyclically varying the distance between the electrodes of the coupling capacitor at a second predetermined frequency when the first and second oscillatory voltages are below the second predetermined frequency, a first resistor connected at one end to that electrode of the coupling capacitor which is remote from the third terminal and at the other end by way of a second resistor to the common terminal, the resistance of the first resistor being higher than that of the second resistor and greater than the impedance of the coupling capacitor at a third predetermined frequency below the second predetermined frequency, a non-inverting amplifier of gain just below unity or lower and having a high input impedance at frequencies at and above the third predetermined frequency greater than the resistance of the first resistor, multiplier means connected to the amplifier output and receiving a non-quadrature reference signal at the second predeterined frequency, and an integrator connected to the output of the multiplier means, the output of the integrator being connected to the junction of the first and second resistors.

12. Apparatus according to claim 1 including a chamber enclosing the sample holder and the second capacitor, and means for varying the temperature within the chamber, wherein one electrode of the sample holder is connected to the said first terminal by way of a first further coaxial line which extends into the chamber, the centre conductor of the further coaxial line contains a duct to which a vacuum can be applied, and the said one electrode and the other electrode of the sample holder have apertures which, in operation, connect with the duct and an aperture in the sample, the first further coaxial line having a low characteristic impedance and a length which is significantly less than a quarter of a wavelength at the highest frequency at which permittivity is to be measured thereby providing a connection of low impedance compared with the impedance of the first capacitor between the said first terminal and the one electrode of the sample holder.

13. Apparatus according to claim 12 including a conductive member having first and second recesses, the first of which connects, in operation, with the duct and applies a vacuum in the duct to one face of the said other electrode and the second of which contains, in operation, a rod spaced therefrom, the rod and the conductive member then forming the electrodes of the second capacitor, and the rod extending to form the centre conductor of a second further coaxial line connecting with the second terminal, and the second further coaxial line has a low characteristic impedance and a length which is significantly less than a quarter of a wavelength at the highest frequency at which permittivity is to be measured thereby providing a connection of low impedance compared with the impedance of the second capacitor between the said second terminal and the second capacitor, and the second further coaxial line having the same characteristic impedance, the same electrical length and the same inner and outer radii as the first further coaxial line.

14. Apparatus according to claim 1 wherein the said signal detector includes first and second correlators receiving a signal representative of the voltage between the third and common terminals and respective reference signals substantially in phase quadrature with each other, each correlator providing an output signal representative of the integral over a predetermined interval of the product of the voltage between the third and common terminals and the respective reference signal.

15. Apparatus according to claim 11 wherein the said signal detector includes
means for repeatedly integrating the output of the said integrator over intervals which are integral submultiples of the period of the first and second oscillatory voltages when the frequencies of these voltages are below a third predetermined frequency and the apparatus includes a computer programmed to implement two software correlators in the computer, the computer being connected to receive the output of the means for repeated integration and generating in software reference signals representing a waveform at the frequency of the oscillatory voltages and in phase quadrature with one another, each software correlator providing, in operation, an output signal representative of the integral over a predetermined number of periods of the oscillatory voltages of the product of a respective one of the reference signals and the voltage between the third and common terminals.

16. Apparatus according to claim 14 including
means for generating at least two further oscillatory voltages at a frequency which is adjustable over a wide frequency range for application between the first and common terminals, and the second and common terminals, respectively, from source impedances which are low compared with the impedances between the first and common terminals, and between the second and common terminals, respectively, and
means for independently adjusting the relative phase and amplitude of the further voltages before application to the said terminals and for providing a precise indication of the said relative phase and amplitude, and wherein
the said signal detector includes at least two further correlators allowing balance between voltages between the third and common terminals due to the further voltages to be determined in practice or theoretically, whereby the complex permittivities of the sample at least at two frequencies can be calculated.

17. Apparatus according to claim 15 including
means for generating at least two further oscillatory voltages at a frequency which is adjustable over a wide frequency range for application between the first and common terminals, and the second and common terminals, respectively, from source impedances which are low compared with the impedances between the first and common terminals, and between the second and common terminals, respectively, and means for independently adjusting the relative phase and amplitude of the further voltages before application to the said terminals and for providing a precise indication of the said relative phase and amplitude, and wherein the said signal detector includes at least two further correlators allowing balance between voltages between the third and common terminals due to the further voltages to be determined in practice or theoretically, whereby the complex permittivities of the sample at least at two frequencies can be calculated.

18. Apparatus according to claim 1 including a computer connected to control the means for adjusting the relative phase and amplitude of the two oscillatory voltages and to provide an output representative of the permittivity of the sample.

19. A method of determining the permittivity of a sample of material over a wide frequency band and a wide temperature range comprising the steps of forming a first capacitor with a sample as dielectric within a temperature controlled chamber, connecting a second capacitor having no significant resistive or inductive component of impedance over the said band, in series with the first capacitor between first and second terminals, adjusting the temperature in the chamber to a value within a range to be measured, generating two oscillatory voltages at the same frequency having known relative phase and amplitude and applying a first of these voltages between the first terminal and a common terminal, and a second of these voltages between the second terminal and the common terminal, using a signal detector to obtain an indication of an amount of out-of-balance voltage between a third terminal between the first and second capacitors and the common terminal, determining values of the said relative phase and amplitude of the two voltages which give zero out-of-balance voltage and calculating the complex permittivity of the sample at the said frequency from the values determined, and repeating the steps of adjusting the temperature within the chamber, generating two voltages, obtaining an indication of the out-of-balance voltage, determining the values of relative phase and amplitude and calculating permittivity for a plurality of different frequencies of the two oscillatory voltages over the said band and a plurality of different temperatures over the said range.

20. Apparatus according to claim 1 wherein the signal detector connected to the third terminal includes a d.c. to high frequency high-impedance amplifier circuit comprising a coupling capacitor having first and second air spaced electrodes, the first electrode being connected to an input terminal and the second electrode having a capacity to an intermediate conductor which has capacity to ground, means for cyclically varying the distance between the electrodes of the coupling capacitor at a first predetermined frequency for use when an input signal applied to the input terminal is in a part of the frequency spectrum below the predetermined frequency, a first resistor connected at one end to the said second electrode and at the other end by way of a second resistor to ground, the resistance of the first resistor being higher than that of the second resistor and greater than the impedance of the coupling capacitor at a further predetermined frequency below the first predetermined frequency, a non-inverting amplifier having a high input impedance compared with the resistance of the first resistor and a low output impedance over a frequency band from the further predetermined frequency to a high frequency and a gain of just below unity or lower, multiplier means connected to the amplifier output and receiving a non-quadrature reference signal at the first predetermined frequency, an integrator connected to the output of the multiplier means, and means for connecting the output of the integrator to the junction of the first and second resistors, the output of the non-inverting amplifier being connected to the said intermediate conductor, the output of the amplifier circuit at frequencies above the further predetermined frequency being taken from the output of the non-inverting amplifier, and the output of the amplifier circuit at frequencies below the further predetermined frequency being taken from the output of the integrator.

21. A method as in claim 19, comprising the further step of adjusting said two oscillatory voltages until said signal detector indicates said zero out-of-balance voltage and calculating the complex permittivity of the sample at the said frequency from the values determined.

22. A method as in claim 19, comprising the further step of calculating predicted values for said two oscillatory voltages which would provide said zero out of balance voltage, based on said out of balance voltage, and calculating the complex permittivity of the sample at the said frequency from the values determined.

23. A method according to claim 8 wherein the step of generating two oscillatory voltages having known relative phase and amplitude comprises generating a first voltage as one of the oscillatory voltages, generating a second voltage as the other of the oscillatory voltages having first and second components with phase relationships approximately as follows: the first component leading the first voltage by 180° and the second component leading the first voltage by 90°, determining the values of the said relative phase and amplitude of the two voltages which give zero out-of-balance voltage comprises obtaining a first out-of-balance signal representative of the phase and amplitude of the voltage between the third terminal and the common terminal for an out-of-balance condition, obtaining second and third out-of-balance signals by changing at least the first and second components from the values used to obtain the first out-of-balance signal in such a way that the changes are not phase aligned, and calculating the required relative phase and amplitude of the two oscillatory voltages for balance from the first, second and third out-of-balance signals.

24. A method according to claim 23 wherein the step of determining the values of the said relative phase and amplitude of the two voltages which give zero out-of-balance voltage comprises applying the two voltages to a reference bridge comprising two further capacitors connected in series between the first and second terminals and a further signal detector coupled between a fourth terminal, between the further capacitors, and the common terminal, the two voltages being applied between the first and common terminals, and the second and common terminals, respectively, obtaining a first out-of-balance signal for the reference bridge representative of the phase and amplitude of the voltage between the fourth terminal and the common terminal, obtaining second and third out-of-balance signals by changing at least the first and second components from the values used to obtain the first out-of-balance signal from the reference bridge in such a way that the changes are not phase aligned, and using the first, second and third out-of-balance signals from the reference bridge in calculating the required relative phase and amplitude of the two oscillatory voltages.

25. A method according to claim 23 for use at very low frequencies wherein the step of determining the values of the said relative phase and amplitude of the said two voltages comprises obtaining a first out-of-balance signal representative of the phase and amplitude of the voltage between the third terminal and the common terminal for an out-of-balance condition, obtaining a second out-of-balance signal by changing at least the first and second components from the values used to obtain the first out-of-balance signal in such a way that the change is not phase aligned, and calculating the required relative phase and amplitude of the two oscillatory voltages for balance from the first, second and third out-of-balance signals, and integrating the signal which appears between the third and common terminals over a set of intervals each less than the period of the said two voltages but together normally equal to the said period, and carrying out a Fourier analysis of the resultant partial integrals to obtain an output representative of the component of the out-of-balance signal at the frequency of the said two voltages.

26. A method according to claim 8 wherein the step of generating two oscillatory voltages having known relative phase and amplitude comprises generating a first voltage as one of the oscillatory voltages, generating a second voltage as the other of the oscillatory voltages having first and second components with phase relationships approximately as follows:
the first component leading the first voltage by 180° and the second component leading the first voltage by 90°, and adjusting further capacitors connected in series between the first and second terminals and the phases and amplitudes of the first voltage and the first and second components using a further signal detector coupled between a fourth terminal, between the further capacitors, and the common terminal to ensure that the first voltage and the first and second components have the said phase relationships without significant approximation and the two oscillatory voltages have a desired relative phase and amplitude.

27. A method according to claim 26 wherein the step of adjusting the further capacitors comprises adjusting the further capacitors, using only the first component of the second voltage, to have a capacitance ratio equal to the required relative amplitude of the said two voltages by a process which involves minimising the out-of-balance voltages between both the third and common terminals, and the fourth and common terminals, using the further capacitors and the output of the further detector to correct the phase of the second component, and using the further capacitors and the output of the further detector to derive an imaginary component of one of the two voltages which give zero out-of-balance voltage between the third and common terminals when the other such voltage is considered to have no imaginary component.

28. Apparatus as in claim 1, wherein said relative phases and amplitudes at a time when said signal detector measures a zero out of balance signal are used to calculate said complex permittivity.

29. Apparatus as in claim 1, further comprising a computer receiving said out of balance signal from said signal detector, for calculating values of said two oscillatory voltages which will cause a zero out of balance signal, the calculated values being used to calculate said complex permittivity.

30. A method as in claim 8, comprising the further step of adjusting said two oscillatory voltages until said signal detector indicates said zero out-of-balance voltage and calculating the complex permittivity of the sample at the said frequency from the values determined.

31. A method as in claim 8, comprising the further step of calculating predicted values for said two oscillatory voltages which would provide said zero out of balance voltage, based on said out of balance voltage, and calculating the complex permittivity of the sample at the said frequency from the values determined.

* * * * *